(12) United States Patent
Yamazaki et al.

(10) Patent No.: US 7,294,535 B1
(45) Date of Patent: Nov. 13, 2007

(54) CRYSTALLINE SEMICONDUCTOR THIN FILM, METHOD OF FABRICATING THE SAME, SEMICONDUCTOR DEVICE, AND METHOD OF FABRICATING THE SAME

(75) Inventors: Shunpei Yamazaki, Tokyo (JP); Hisashi Ohtani, Kanagawa (JP); Tamae Takano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/352,373

(22) Filed: Jul. 13, 1999

(30) Foreign Application Priority Data

Jul. 15, 1998 (JP) ................................. 10-200978
May 14, 1999 (JP) ................................. 11-135053

(51) Int. Cl.
*H01L 21/00* (2006.01)
(52) U.S. Cl. ...................... 438/149; 438/479; 438/482; 438/491; 438/517
(58) Field of Classification Search ................ 438/149, 438/479, 517, 151, 475, 476, 486, 487, 491, 438/482, 150
See application file for complete search history.

(56) References Cited

U.S. PATENT DOCUMENTS

| 4,986,213 A | 1/1991 | Yamazaki et al. |
| 5,147,826 A | 9/1992 | Liu et al. |
| 5,365,875 A | 11/1994 | Asai et al. ...................... 117/7 |
| 5,403,772 A | 4/1995 | Zhang et al. |
| 5,426,064 A | 6/1995 | Zhang et al. |
| 5,461,250 A | 10/1995 | Burghartz et al. |
| 5,481,121 A | 1/1996 | Zhang et al. |
| 5,492,843 A | 2/1996 | Adachi et al. |
| 5,514,879 A | 5/1996 | Yamazaki |
| 5,529,937 A | 6/1996 | Zhang et al. |
| 5,563,426 A | 10/1996 | Zhang et al. |
| 5,569,610 A | 10/1996 | Zhang et al. |

(Continued)

FOREIGN PATENT DOCUMENTS

JP 07-038113 2/1995

(Continued)

OTHER PUBLICATIONS

H. Dorin, Chemistry, The Study of Matter, Chapter 18, Chemical Equilbruim, p. 532.

(Continued)

*Primary Examiner*—Fernando L. Toledo
(74) *Attorney, Agent, or Firm*—Eric J. Robinson; Robinson Intellectual Property Law Office, P.C.

(57) ABSTRACT

There is provided a technique to form a single crystal semiconductor thin film or a substantially single crystal semiconductor thin film. A heat treatment is carried out for an amorphous semiconductor thin film, to thereby obtain a crystalline semiconductor thin film. After the crystalline semiconductor thin film is irradiated with ultraviolet light or infrared light, a heat treatment at a temperature range of 900 to 1200° C. is carried out in a reducing atmosphere. The surface of the crystalline semiconductor thin film is extremely flattened through this step, defects in crystal grain boundaries and crystal grains disappear, and the single crystal semiconductor thin film or substantially single crystal semiconductor thin film is obtained.

76 Claims, 10 Drawing Sheets

U.S. PATENT DOCUMENTS

| | | | |
|---|---|---|---|
| 5,578,520 A | 11/1996 | Zhang et al. | |
| 5,594,569 A | 1/1997 | Konuma et al. | 349/122 |
| 5,604,360 A | 2/1997 | Zhang et al. | |
| 5,605,846 A | 2/1997 | Ohtani et al. | |
| 5,608,232 A | 3/1997 | Yamazaki et al. | |
| 5,616,506 A | 4/1997 | Takemura | 438/150 |
| 5,616,932 A | 4/1997 | Sano et al. | |
| 5,616,935 A | 4/1997 | Koyama et al. | |
| 5,620,910 A | 4/1997 | Termoto | |
| 5,639,698 A | 6/1997 | Yamazaki et al. | |
| 5,643,826 A | 7/1997 | Ohtani et al. | 437/88 |
| 5,648,276 A | 7/1997 | Hara et al. | |
| 5,693,541 A | 12/1997 | Yamazaki et al. | |
| 5,696,386 A | 12/1997 | Yamazaki | 257/57 |
| 5,712,191 A | 1/1998 | Nakajima et al. | 437/174 |
| 5,789,762 A | 8/1998 | Koyama et al. | |
| 5,795,795 A | 8/1998 | Kousai et al. | |
| 5,808,321 A | 9/1998 | Mitanaga et al. | |
| 5,837,619 A | 11/1998 | Adachi et al. | |
| 5,843,833 A | 12/1998 | Ohtani et al. | |
| 5,846,869 A | 12/1998 | Hashimoto et al. | 438/365 |
| 5,854,096 A | 12/1998 | Ohtani et al. | 438/166 |
| 5,869,363 A * | 2/1999 | Yamazaki et al. | 438/166 |
| 5,869,387 A * | 2/1999 | Sato et al. | 438/459 |
| 5,879,974 A | 3/1999 | Yamazaki | |
| 5,879,977 A * | 3/1999 | Zhang et al. | 438/166 |
| 5,888,857 A | 3/1999 | Zhang et al. | 438/162 |
| 5,891,764 A | 4/1999 | Ishihara et al. | |
| 5,897,347 A * | 4/1999 | Yamazaki et al. | 438/166 |
| 5,907,770 A | 5/1999 | Yamazaki et al. | |
| 5,910,015 A | 6/1999 | Sameshima et al. | |
| 5,923,962 A | 7/1999 | Ohtani et al. | 438/150 |
| 5,923,966 A | 7/1999 | Teramoto et al. | |
| 5,953,597 A | 9/1999 | Kusumoto et al. | |
| 5,956,579 A * | 9/1999 | Yamazaki et al. | 438/151 |
| 5,960,323 A | 9/1999 | Wakita et al. | 438/795 |
| 5,985,681 A * | 11/1999 | Hamajima et al. | 438/8 |
| 5,985,740 A * | 11/1999 | Yamazaki et al. | 438/486 |
| 5,994,172 A | 11/1999 | Ohtani et al. | |
| 6,023,074 A | 2/2000 | Zhang | |
| 6,027,960 A | 2/2000 | Kusumoto et al. | |
| 6,027,987 A | 2/2000 | Yamazaki et al. | |
| 6,054,739 A | 4/2000 | Yamazaki et al. | |
| 6,071,764 A | 6/2000 | Zhang et al. | |
| 6,071,766 A * | 6/2000 | Yamazaki et al. | 438/166 |
| 6,071,796 A | 6/2000 | Voutsas | |
| 6,077,731 A | 6/2000 | Yamazaki et al. | 438/150 |
| 6,077,758 A | 6/2000 | Zhang et al. | |
| 6,093,587 A | 7/2000 | Ohtani | |
| 6,093,934 A | 7/2000 | Yamazaki et al. | |
| 6,093,937 A | 7/2000 | Yamazaki et al. | 257/59 |
| 6,096,581 A | 8/2000 | Zhang et al. | |
| 6,100,562 A | 8/2000 | Yamazaki et al. | |
| 6,121,076 A | 9/2000 | Zhang et al. | 438/150 |
| 6,124,154 A | 9/2000 | Miyasaka | |
| 6,140,165 A | 10/2000 | Zhang et al. | |
| 6,140,667 A | 10/2000 | Yamazaki et al. | |
| 6,180,439 B1 * | 1/2001 | Yamazaki et al. | 438/162 |
| 6,197,624 B1 | 3/2001 | Yamazaki | |
| 6,221,738 B1 * | 4/2001 | Sakaguchi et al. | 438/455 |
| 6,285,042 B1 | 9/2001 | Ohtani et al. | |
| 6,335,541 B1 | 1/2002 | Ohtani et al. | |
| 6,365,933 B1 | 4/2002 | Yamazaki et al. | |
| 6,559,036 B1 | 5/2003 | Ohtani et al. | |
| 6,838,698 B1 * | 1/2005 | Yamazaki et al. | 257/66 |
| 2001/0036692 A1 | 11/2001 | Yamazaki et al. | |
| 2002/0013114 A1 | 1/2002 | Ohtani et al. | |
| 2002/0100937 A1 | 8/2002 | Yamazaki et al. | |
| 2002/0119633 A1 | 8/2002 | Yamazaki et al. | |
| 2003/0094625 A1 | 5/2003 | Yamazaki et al. | |

FOREIGN PATENT DOCUMENTS

| | | |
|---|---|---|
| JP | 7-130652 | 5/1995 |
| JP | 08-078329 | 3/1996 |
| JP | 09-186336 | 7/1997 |
| JP | 09-312260 | 12/1997 |
| JP | 10-125927 | 5/1998 |
| JP | 10-135469 | 5/1998 |

OTHER PUBLICATIONS

"Characterization of High-Efficiency Cast-Si Solar Cell Wafers by MBIC Measurement", Ryuichi Shimokawa et al., Japanese Journal of Applied Physics, vol. 27, No. 5, pp. 751-758, 1988.

"Characteristics and Driving Scheme of Polymer-Stabilized Monostable FLCD Exhibiting Fast Response Time and High Contrast Ratio with Gray-Scale Capability", H. Furue et al., SID 1998.

"A Full-Color Thresholdless Antiferroelectric LCD Exhibiting Wide Viewing Angle with Fast Response Time", T. Yoshida et al., SID DIGEST, pp. 841-844, 1997.

"Thresholds antiferroelectricity in liquid crystals and its application to displays", S. Inui t al., J. Mater. Chem., 6 (4), pp. 671-673, 1996.

Aya et al., "Improvement of SPC Poly-Si Film Using the ELA Method", pp. 167-170, 1997, AM-LCD 97, Digest of Technical Papers.

Abe et al., "High Performance Poly-Crystalline Silicon TFT's Fabricated Using the SPC and ELA Methods", pp. 85-88, 1998, AM-LCD 98, Digest of Technical Papers.

Specification & Drawings of U.S. Appl. No. 09/352,362.
Specification & Drawings of U.S. Appl. No. 09/352,194.
Specification & Drawings of U.S. Appl. No. 09/352,198.
Specification & Drawings of U.S. Appl. No. 09/894,125.
Specification & Drawings of U.S. Appl. No. 09/369,158.
Specification & Drawings of U.S. Appl. No. 09/908,727.

H. Furue, *Characteristics and Driving Scheme of Polymer-Stabilized Monostable FLCD Exhibiting Fast Response Time and High Contrast Ratio with Gray-Scale Capability*, SID, 1998, pp. 782-785.

H. Dorin, *Chemistry, The Study of Matter*, Chapter 18, Chemical Equilibrium, Prentice Hall, 4th Edition, Jan. 1, 1992, p. 532.

* cited by examiner

| OBSERVATION REGION | BEFORE HIGH TEMPERATURE ANNEALING | AFTER HIGH TEMPERATURE ANNEALING |
|---|---|---|
| 1 | 13.623 | 40.925 |
| 2 | 20.027 | 51.126 |
| 3 | 20.629 | 59.364 |
| 4 | 21.798 | 48.539 |
| 5 | 16.666 | 55.341 |
| 6 | 15.097 | 46.510 |
| 7 | 13.120 | 57.655 |
| 8 | 14.035 | 51.120 |
| 9 | 12.599 | 54.416 |
| 10 | 20.699 | 36.945 |
| MINIMUM VALUE (%) | 12.60 | 36.95 |
| MAXIMUM VALUE (%) | 21.80 | 59.36 |
| AVERAGE VALUE (%) | 16.83 | 50.19 |
| STANDARD DEVIATION $\sigma$ | 3.61 | 7.18 |

FIG. 14   Bearing Ratio (%) at (P-V value)/2

CRYSTALLINE SEMICONDUCTOR THIN FILM, METHOD OF FABRICATING THE SAME, SEMICONDUCTOR DEVICE, AND METHOD OF FABRICATING THE SAME

BACKGROUND OF THE INVENTION

1. Field of the Invention

The present invention relates to a technique on a semiconductor device using a semiconductor thin film, and particularly to a semiconductor device constituted by a thin film transistor (TFT) using a crystalline silicon film and a method of fabricating the same.

Incidentally, in the present specification, the term "semiconductor device" means any devices functioning by using semiconductor characteristics. Thus, the semiconductor device includes not only a single semiconductor component such as a TFT, but also an electro-optical device or semiconductor circuit including TF's and an electronic apparatus having those.

2. Description of the Related Art

In recent years, a TFT used for an electro-optical device such as an active matrix type liquid crystal display device has been actively developed.

The active matrix type liquid crystal display device is a monolithic display device in which a pixel matrix circuit and a driver circuit are provided on the same substrate. Moreover, a system-on-panel having a built-in logic circuit such as a γ-correction circuit, a memory circuit, and a clock generating circuit has been also developed.

Since such a driver circuit and a logic circuit are required to perform a high speed operation, it is unsuitable to use a noncrystalline silicon film (amorphous silicon film) as an active layer. Thus, under the present circumstances, a TFT using a crystalline silicon film (single crystal silicon film or polysilicon film) as an active layer has been examined.

The present assignee discloses a technique set forth in Japanese Patent Laid-Open No. Hei. 7-130652, which is herein incorporated by reference, as a technique for obtaining a crystalline silicon film on a glass substrate. The technique disclosed in the publication is such that a catalytic element for facilitating crystallization is added into an amorphous silicon film, and a heat treatment is carried out to obtain a crystalline silicon film.

According to this technique, it is possible to greatly lower the crystallization temperature of the amorphous silicon film through the action of the catalytic element by 50 to 100° C., and is also possible to decrease a time required for crystallization down to ⅕ to ⅒.

However, when circuit performance comparable to a conventional LSI comes to be required for a circuit assembled with TFTs, such circumstances have occurred that it is difficult to fabricate a TFT having satisfactory performance to meet the specification by using a crystalline silicon film formed with a conventional technique.

SUMMARY OF THE INVENTION

An object of the present invention is to provide a technique for realizing a single crystal semiconductor thin film or a substantially single crystal semiconductor thin film. Incidentally, the substantially single crystal semiconductor thin film means a crystalline semiconductor thin film such as a polycrystalline semiconductor thin film which gets rid of a portion to function as a barrier against movement of carriers, such as a crystal grain boundary or defect.

Another object of the present invention is to realize a high performance TFT including the single crystal semiconductor thin film or the substantially single crystal semiconductor thin film of the invention as a channel formation region, and to provide a high performance semiconductor device including a circuit assembled with the TFT.

Incidentally, in the present specification, a semiconductor thin film having crystallinity, such as a single crystal semiconductor thin film, a polycrystalline semiconductor thin film, and a microcrystalline semiconductor thin film, is generically referred to as a crystalline semiconductor thin film.

According to one aspect of the present invention, a method of fabricating a crystalline semiconductor thin film, comprises the steps of:

carrying out a first heat treatment to transform an amorphous semiconductor thin film into a crystalline semiconductor thin film; and carrying out a second heat treatment for the crystalline semiconductor thin film at 900 to 1200° C. in a reducing atmosphere.

In the above structure, the second heat treatment has only to be carried out at such a temperature that a natural oxidation film (for example, silicon oxide film) formed on the surface of the crystalline semiconductor thin film can be reduced, and is specifically carried out in a temperature range of 900 to 1200° C. (preferably 1000 to 1100° C.). Besides, it is preferable that a treatment time is at least 3 minutes or more, typically 3 minutes to 2 hour, and representatively 10 minutes to 30 minutes. This is a time required to exhibit effects of the second heat treatment.

Incidentally, the second heat treatment may be carried out after the crystalline semiconductor thin film is converted into island-like portions. Besides, the heat treatment is carried out by furnace annealing (annealing carried out in an electrothermal furnace).

The feature of the present invention is that a crystalline semiconductor thin film is first formed by using a well-known technique, and the crystalline semiconductor thin film is subjected to the heat treatment at 900 to 1200° C. in the reducing atmosphere (typically, hydrogen atmosphere).

This step first has an effect to flatten the surface of the crystalline semiconductor thin film. This is a result of enhanced surface diffusion of semiconductor atoms to make the surface energy minimum. Besides, at the same time, this step has also an effect to greatly decrease defects existing in crystal grains and crystal grain boundaries. This effect is obtained through a terminating effect of uncombined bonds by hydrogen, a removing effect of impurities by hydrogen, and recombination of semiconductor atoms with the effect. Thus, for the purpose of causing these effects to be effectively exhibited, the treatment time as set forth above becomes necessary.

Thus, it is necessary to carry out the heat treatment step in the reducing atmosphere by furnace annealing. If the heat treatment is carried out by irradiation of ultraviolet light or infrared light, recrystallization progresses in a nonequilibrium state so that continuity of crystal lattices at crystal grain boundaries is damaged, which is not preferable. In this point, in the furnace annealing, since recrystallization progresses in an equilibrium state, such a problem can be avoided.

Moreover, according to another aspect of the present invention, a method of fabricating a crystalline semiconductor thin film is characterized by comprising the steps of: adding a catalytic element for facilitating crystallization of an amorphous semiconductor thin film to a part or an entire region of the amorphous semiconductor thin film; carrying out a first heat treatment to transform the part or the entire region of the amorphous semiconductor thin film into a crystalline semiconductor thin film; carrying out a second heat treatment of irradiating the crystalline semiconductor thin film with ultraviolet light or infrared light; and carrying out a third heat treatment for the crystalline semiconductor thin film at 900 to 1200° C. in a reducing atmosphere.

This structure has a feature in that after the crystalline semiconductor thin film is formed, irradiation with ultraviolet light or infrared light is carried out to improve the crystallinity. Incidentally, the improvement of crystallinity means lowering of defects and levels existing in the crystal grains or crystal grain boundaries.

In this case, when ultraviolet light is used, it is appropriate that excimer laser light or light emitted from an ultraviolet lamp is used, and when infrared light is used, it is appropriate that light emitted from an infrared lamp is used.

However, when irradiation of ultraviolet light or infrared light is carried out, attention must be paid to energy of light. This is because if the crystalline silicon film is excessively heated here, there is a possibility that the continuity of crystal lattices at crystal grain boundaries is damaged. According to experiments, if the temperature of the film surface is 600 to 800° C., the crystallinity can be improved without damaging the continuity of the crystal lattices. For example, in terms of excimer laser energy, it is appropriate that irradiation is carried out at 100 to 300 mJ/cm$^2$.

The effect of flattening is very effective in the case where the crystalline film is irradiated with excimer laser ultraviolet light.

When irradiation of excimer laser is made, the semiconductor film is instantaneously melted from its surface, and then, the melted semiconductor film is cooled and solidified from a substrate side by heat conduction to the substrate. In this solidifying step, the melted semiconductor film is recrystallized, and becomes a crystalline semiconductor thin film with a large grain diameter. However, since the film is once melted, volume expansion occurs so that asperities (ridges) are produced on the surface of the semiconductor film. In the case of a top gate type TFT, since the surface having the asperities becomes an interface to a gate insulating film, the component characteristics are greatly affected.

BRIEF DESCRIPTION OF THE DRAWINGS

FIG. 14 shows statistical data of bearing ratios at ½ of P-V of the present invention.

DETAILED DESCRIPTION OF THE PREFERRED EMBODIMENTS

Figure 1A:
FIGS. 1A to 1G are views showing fabricating steps of a thin film transistor of Embodiment 1.

First, by using experimental results obtained by the present inventor, an effect of high temperature annealing of the present invention will be described.

An experimental procedure will first be explained. An amorphous silicon film with a thickness of 50 nm was formed on a quartz substrate. A low pressure CVD method was used for film formation, and disilane ($Si_2H_6$) (flow rate: 250 sccm) and helium (He) (flow rate: 300 sccm) were used as film forming gases. The temperature of the substrate was made 465° C. and the pressure at film formation was made 0.5 torr.

The surface of the amorphous silicon film was etched by buffered hydrofluoric acid to remove a natural oxidation film and pollution. Next, the amorphous silicon film was irradiated with XeCl excimer laser light to be crystallized. An atmosphere at the laser irradiation was the air, and the substrate temperature was room temperature, the density of laser energy was 400 mJ/cm$^2$, and the pulse width of the laser light was 150 nsec.

Then the crystalline silicon film was subjected to a high temperature annealing treatment. The condition of the high temperature annealing treatment was made as follows: An atmosphere was made hydrogen of 100%, the degree of vacuum was 700 torr, annealing temperature was 1000° C., and an annealing time was 25 minutes. Incidentally, before the high temperature annealing treatment, the crystalline silicon film was subjected to a wet etching treatment by hydrofluoric acid, so that a natural oxidation film and pollution on the surface were removed.

Figure 8:
FIG. 8 is a SEM observation photograph of the surface of a crystalline silicon film before high temperature annealing of the present invention.
Figure 9:
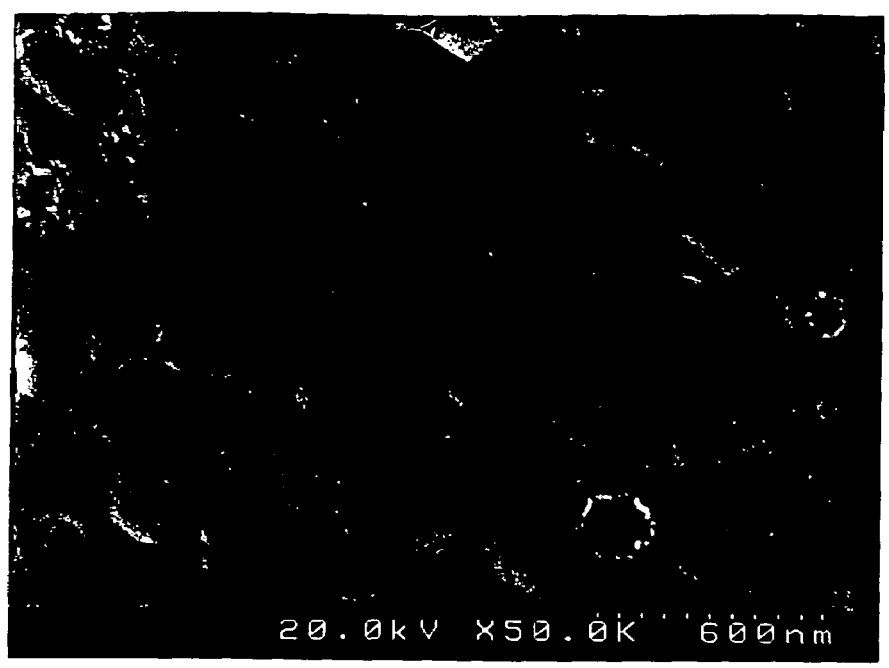
FIG. 9 is a SEM observation photograph of the surface of the crystalline silicon film after high temperature annealing of the present invention.

For the purpose of ascertaining the effect of the high temperature annealing, the surface of the crystalline silicon film before and after the high temperature annealing was observed by SEM. FIG. 8 shows an observation photograph before the high temperature annealing, and FIG. 9 shows an observation photograph after the high temperature annealing. As is apparent from FIGS. 8 and 9, the surface shapes are clearly different before and after the high temperature annealing.

Figure 10:
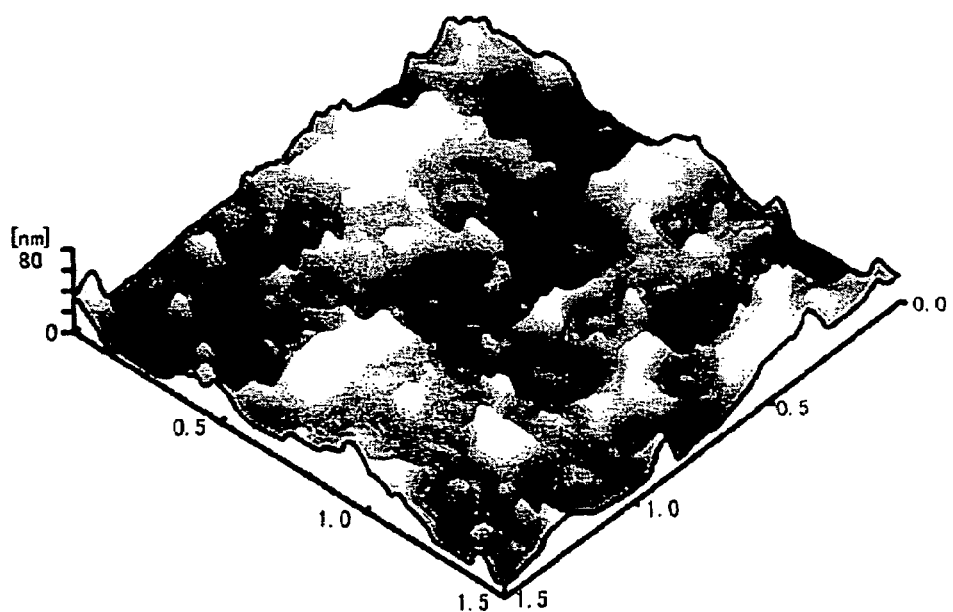
FIG. 10 is an AFM image of the surface of a crystalline silicon film before high temperature annealing of the present invention.
Figure 11:
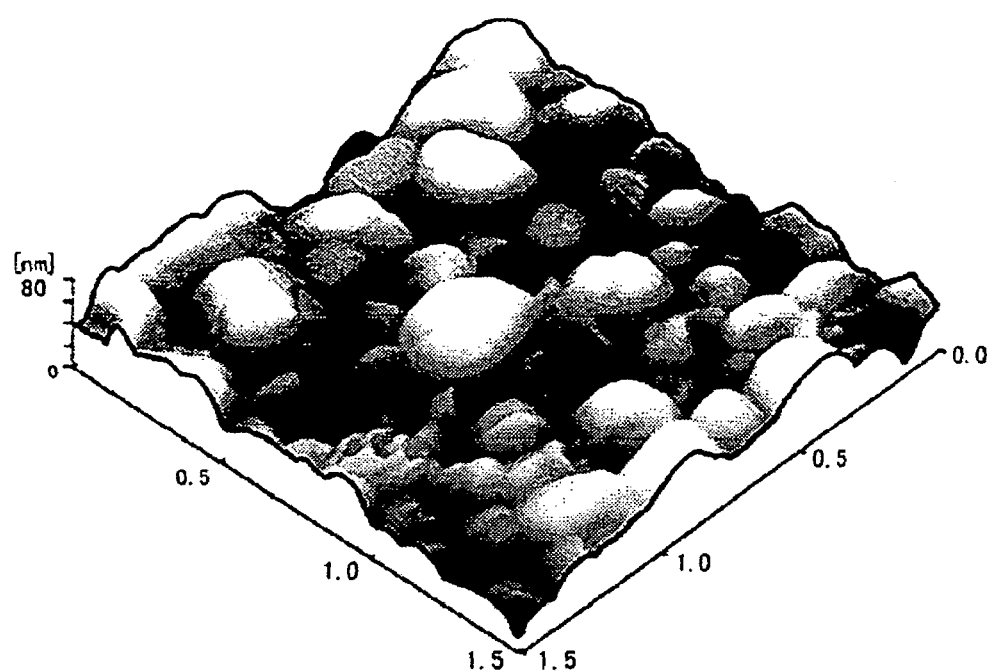
FIG. 11 is a AFM image of the surface of the crystalline silicon film after high temperature annealing of the present invention.

Further, the surface shape of the silicon film was also observed by an AFM (Atomic Force Microscope). FIG. 10 shows an observation image of the crystalline silicon film by the AFM before the high temperature annealing, and FIG. 11 shows an observation image of the crystalline silicon film by the AFM after the high temperature annealing. Incidentally, the range of observation is a rectangular region of 1.5 μm×1.5 μm in both FIGS. 10 and 11.

As is apparent from FIGS. 10 and 11, the surface shapes of the crystalline silicon film before and after the high temperature annealing are clearly different. Although asperities exist on the surface of the crystalline silicon film before and after the high temperature annealing, before the high temperature annealing, a protrusion is steep, and its top portion is sharp, and the surface totally shows a serrate shape. When the surface having such protrusions becomes an interface between a gate insulating film and a channel formation region, it is thinkable that the component characteristics suffer a very bad influence. On the contrary, a protrusion after the high temperature annealing is smooth, and its top portion is round, so that the characteristics of the interface between the gate insulating film and the channel formation region are improved as compared with those before the high temperature annealing.

Although it is understood that the surface of the crystalline silicon film is flattened and smoothed by the high temperature annealing even from the observation images shown in FIGS. 8 to 11, a histogram distribution of heights of AFM images was calculated so as to further quantify the difference of the surface shapes before and after the high temperature annealing. Further, a bearing ratio curve of the histogram distribution was calculated. The bearing ratio curve is a curve expressing a cumulative frequency of the histogram distribution.

Figure 12:
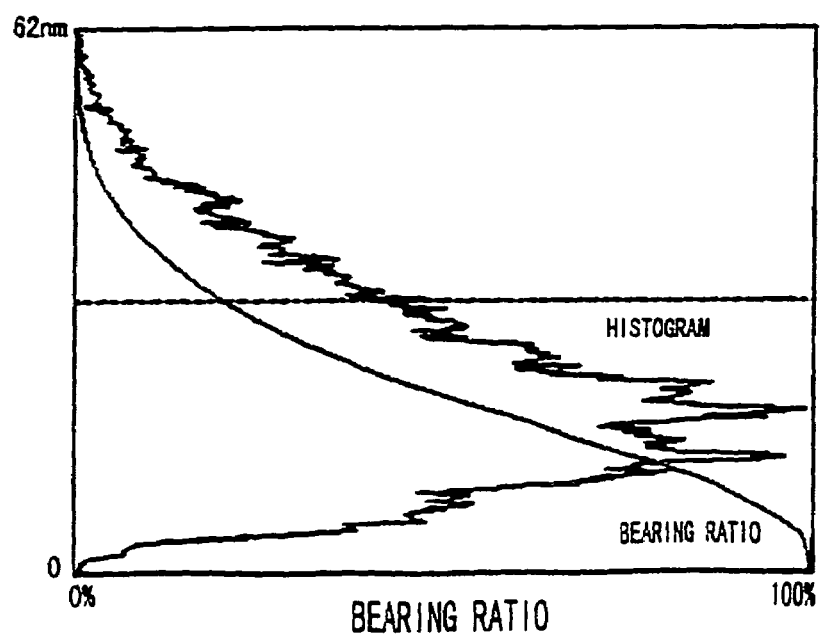
FIG. 12 is a histogram distribution and a bearing ratio curve of the height of an AFM image before high temperature annealing.
Figure 13:
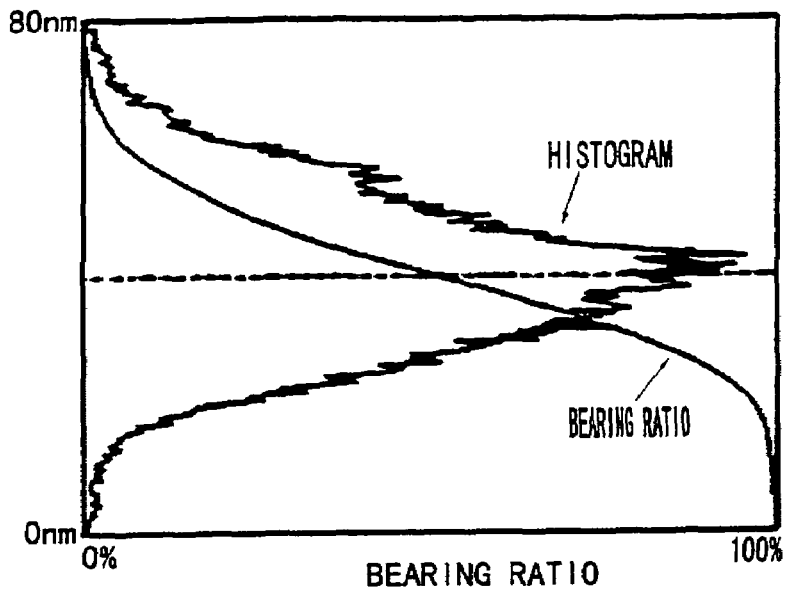
FIG. 13 is a histogram distribution and a bearing ratio curve of the height of the AFM image after high temperature annealing of the present invention.

FIGS. 12 and 13 show the histogram of the heights of the AFM images and the bearing ratio curve. FIG. 12 shows data before the high temperature annealing, and a pitch of the histogram is about 0.16 nm. FIG. 13 shows data after the high temperature annealing, and a pitch of the histogram is about 0.20 nm.

The measurement region by the AFM is 1.5 μm×1.5 μm. The bearing ratio curve is a curve expressing the cumulative frequency of data of the histogram. The curves of FIGS. 12 and 13 are obtained through accumulation from the maximum value of the height, and expresses an occupation ratio (%) of areas with height from the maximum value to an arbitrary value to the total area. In FIGS. 12 and 13, the horizontal line shown by a dotted line in the graph indicates the value of ½ of the P-V value (Peak to Valley, difference between the maximum value and the minimum value in height).

Further, in the silicon film before and after the high temperature annealing, the AFM images were observed in ten regions (rectangle region of 1.5 μm×1.5 μm), and the bearing ratios at $2^{1-}$(P-V value) in the respective observation regions were calculated. FIG. 14 shows the bearing ratios in the respective observation regions and their statistical data.

When the curves in FIGS. 12 and 13 are compared with each other, although the height distribution before the high temperature annealing is inclined toward a low portion side, the inclination is shifted toward a high portion side after the high temperature annealing, and the histogram is symmetrical with respect to the position of ½ of the P-V. This can be easily understood from the bearing ratio curve.

The bearing ratio at the height of $2^{1-}$(P-V) is about 20% in FIG. 12, and about 51% in FIG. 13. That is, an occupation ratio of an area of a region where the height is within the range from the maximum value to $2^{1-}$(P-V value) to the total area is about 20% before the high temperature annealing, and about 51% after the high temperature annealing. From the difference in this ratio as well, it can be understood that the sharp top portion has been rounded and the surface of the silicon film has been flattened by the high temperature annealing.

In the present invention, the surface shape of the crystalline silicon film is quantified by the bearing ratio at $2^{1-}$(P-V value), and from experimental results, it is presumed that the bearing ratio at $2^{1-}$(P-V value), that is, in a predetermined observation region, an occupation ratio of a region where the height exists in the range from the maximum value to $2^{1-}$(P-V value) is within the range of 6 to 28% in the film before the high temperature annealing, and 29 to 72% in the film after the high temperature annealing.

Incidentally, the range of the bearing ratio is set from the statistical data of FIG. 14, and is a value calculated from an average value ±3σ(of the bearing ratio at $2^{1-}$(P-V value). The bearing ratio is a value accumulated from the maximum value of the height.

As described above, since the crystalline semiconductor thin film crystallized by ultraviolet light such as excimer laser light is crystallized after the surface has been melted, the occupying ratio of a region where the height is within the range from the maximum value to ½ of the difference between the maximum value and the minimum value is 6 to 28% to a predetermined region. In the present invention, since this crystalline semiconductor thin film is subjected to the high temperature annealing, the occupation ratio of this region is changed to 29 to 72%, and the top portion of the protrusion of the film surface can be made smooth.

Although the experiment described above is related to an example in which the amorphous silicon film is irradiated with excimer laser light, it is conceivable that almost the same surface shape is obtained also in the case where a crystalline silicon film of the present invention is irradiated. In the present invention, it is conceivable that the bearing ratio before the high temperature annealing becomes larger than the experimental results, and it is estimated that the bearing ratio after the high temperature annealing within the range between is 29 to 72%, typically 35 to 60%.

According to another aspect of the present invention, a method of fabricating a crystalline semiconductor thin film, comprises the steps of:

carrying out a first heat treatment to transform an amorphous semiconductor thin film into a crystalline semiconductor thin film; and carrying out a second heat treatment for the crystalline semiconductor thin film in a reducing atmosphere including a halogen element.

In such an arrangement, the second heat treatment is carried out at a temperature range of 900 to 1200° C. This step aims at a gettering effect by halogen element, and is intended to halogenate the metal element existing in the crystalline semiconductor thin film to be thereby removed.

In the following, preferred embodiments of the present invention will be described in detail.

Embodiment 1

In this embodiment, a process of fabricating a TFT on a substrate by carrying out the present invention will be described. FIGS. 1A to 1G are used for the description.

First, a quartz substrate was prepared as a substrate 101. A material having high heat resistance must be selected as the substrate 101. Instead of the quartz substrate, a substrate of a material having high heat resistance, such as a silicon substrate, a ceramic substrate, or a crystallized glass substrate, may be used.

However, although a base film may not be provided in the case where the quartz substrate is used, it is preferable to provide an insulating film as the base film in the case where other materials are used. As an insulating film, it is appropriate that either one of a silicon oxide film (SiOx), a silicon nitride film (SixNy), a silicon nitride oxide film (SiOxNy), and an aluminum nitride film (AlxNy), or a laminate film of those is used.

Besides, it is effective to use a base film laminate a refractory metal layer and a silicon oxide film since a heat radiation effect is greatly increased. Even the laminate structure of the foregoing aluminum nitride film and the silicon oxide film exhibits a sufficient heat radiation effect.

After the substrate 101 having the insulating surface was prepared in this way, a crystalline silicon film 102 with a thickness of 30 nm was formed by using a well-known crystallization technique. Only the outline will be described in the present embodiment.

First, in this embodiment, disilane ($Si_2H_6$) was used as a film forming gas. An amorphous silicon film with a thickness of 20 to 60 nm was formed by a low pressure CVD method. At this time, it is important to thoroughly control the concentration of impurities, such as C (carbon), N (nitrogen), and O (oxygen) mixed in the film. This is because if the amount of these impurities is high, the progress of crystallization is prevented.

The applicant controlled the impurity concentration so that the concentration of carbon and nitrogen became $5 \times 10^{18}$ atoms/cm$^3$ or less (preferably $1 \times 10^{18}$ atoms/cm$^3$ or less, more preferably $5 \times 10^{17}$ atoms/cm$^3$ or less, further more preferably $2 \times 10^{17}$ atoms/cm$^3$ or less), the concentration of oxygen became $1.5 \times 10^{19}$ atoms/cm$^3$ or less (preferably $5 \times 10^{18}$ atoms/cm$^3$ or less, more preferably $1 \times 10^{18}$ atoms/cm$^3$ or less). Further, control was made so that the concentration of metal elements became $1 \times 10^{17}$ atoms/cm$^3$ or less. When such control of concentration has been made at a film formation stage, if only external pollution is prevented, impurity concentration is not increased during the steps of fabricating a TFT.

When the amorphous silicon film was formed, dehydrogenation was carried out for about one hour at 450° C., and thereafter a heating treatment was added for 12 to 36 hours at a temperature range of 550 to 700° C. (typically, 550 to 650° C.) in an inert gas atmosphere, a hydrogen atmosphere or an oxygen atmosphere, to thereby obtain a crystalline silicon film 102 (FIG. 1A).

Incidentally, if film quality equal to the amorphous silicon film formed by the low pressure CVD method may be obtained, a plasma CVD method may be used. Instead of the amorphous silicon film, an amorphous semiconductor thin film such as a film of silicon germanium (expressed by $Si_xGe_{1-x}(0<X<1)$) in which germanium is contained in an amorphous silicon film may be used. In that case, it is desirable that germanium contained in silicon germanium is made 5 atomic % or less.

Figure 1B:

After the state of FIG. 1A was obtained in this way, the crystalline silicon film 102 was next irradiated with ultraviolet light or infrared light. In this embodiment, a heat treatment was carried out by excimer laser irradiation using XeCl as an excitation gas. Although the beam of the excimer laser may be a linear beam, in order to increase the uniformity of processing, it is desirable that the beam is a planar beam. Incidentally, this irradiation step of ultraviolet light or infrared light may be omitted (FIG. 1B).

Figure 1C:
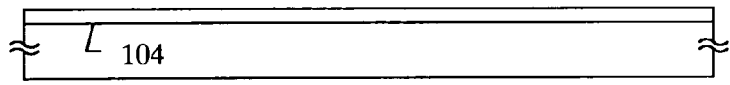

In this way, a crystalline silicon film 103 with improved crystallinity was obtained. Next, a heat treatment within a temperature range of 900 to 1200° C. (preferably 1000 to 1150° C.) was carried out in a reducing atmosphere. In this embodiment, a heat treatment at 1050° C. for 20 minutes was carried out in a hydrogen atmosphere (FIG. 1C).

As the reducing atmosphere, although a hydrogen atmosphere, an ammonia atmosphere, or an inert gas atmosphere (mixture atmosphere of hydrogen and nitrogen or hydrogen and argon) containing hydrogen or ammonia is desirable, flattening of the surface of the crystalline silicon film can be made by even the inert gas atmosphere. However, if reduction of a natural oxidation film is carried out by using a reducing function, a number of silicon atoms with high energy are produced and the flattening effect is consequently raised, so that the reducing atmosphere is preferable.

However, attention must be paid especially to a point that the concentration of oxygen or oxygen compound (for example, OH group) contained in the atmosphere is made 10 ppm or less (preferably 1 ppm or less). Otherwise, the reducing reaction by hydrogen may not occur.

In this way, a crystalline silicon film 104 was obtained. The surface of the crystalline silicon film 104 was greatly flattened by a hydrogen heat treatment at a high temperature such as 900 to 1200° C. Besides, since the heat treatment was carried out at a high temperature, lamination defects and the like hardly existed in the crystal grains. This point will be described later.

After the crystalline silicon film 104 regarded as substantially single crystal was obtained in this way, the crystalline silicon film 104 was next patterned to form an active layer 105. In this embodiment, although the heat treatment in the hydrogen atmosphere is carried out before the active layer is formed, the heat treatment may be carried out after the active layer is formed. In the case, it is preferable that since patterning has been made so that stress generated in the crystalline silicon film is relieved.

Then a thermal oxidation step was carried out so that a silicon oxide film 106 with a thickness of 10 nm was formed on the surface of the active layer 105. This silicon oxide film 106 functions as a gate insulating film. Besides, since the film thickness of the active layer was decreased by 5 nm, the film thickness became 30 nm. In view of the film decrease by the thermal oxidation, it is necessary to determine the film thickness of the amorphous silicon film (starting film) so that an active layer (especially a channel formation region) with a thickness of 5 to 40 nm finally remains.

Figure 1D:
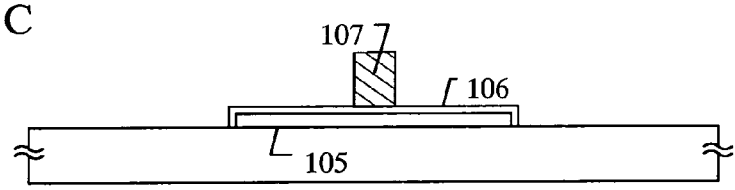
Figure 1E:
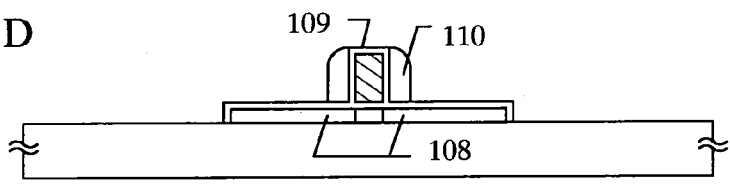

After the gate insulating film 106 was formed, a polycrystalline silicon film having conductivity was formed thereon and a gate wiring line 107 was formed by patterning (FIG. 1D).

In this embodiment, although the polycrystalline silicon film having N-type conductivity is used as the gate wiring line, a material is not limited to this. Particularly, for the purpose of lowering the resistance of the gate wiring line, it is also effective to use tantalum, tantalum alloy, or laminate film of tantalum and tantalum nitride. Further, in order to attain a gate wiring line with low resistance, it is also effective to use copper or copper alloy.

After the state of FIG. 1D was obtained, an impurity to give N-type conductivity or P-type conductivity was added to form an impurity region 108. The impurity concentration at this time was determined in view of an impurity concentration of a subsequent LDD region. In this embodiment, although arsenic with a concentration in $1 \times 10^{18}$ atoms/cm$^3$ was added, it is not necessary to limit the impurity and the concentration to those of this embodiment.

Next, a thin silicon oxide film 109 with a thickness of about 5 to 10 nm was formed on the surface of the gate wiring line 107. It is appropriate that this film is formed by using a thermal oxidation method or a plasma oxidation method. The formation of this silicon oxide film 109 has an object to cause the film to function as an etching stopper in a subsequent side wall forming step.

After the silicon oxide film 109 that functions as an etching stopper was formed, a silicon nitride film was formed and etch back was carried out, so that a side wall 110 was formed. In this way, the state of FIG. 1E was obtained.

Incidentally, in this embodiment, although the silicon nitride film was used as the side wall, it is also possible to use a polycrystalline silicon film or an amorphous silicon film. Of course, it is needless to say that if a material of the gate wiring line is changed, a material which can be used as the side wall is also changed according to that.

Figure 1F:
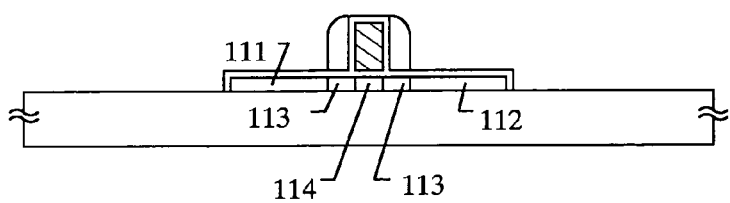

Next, an impurity with the same conductivity as that in the previous step was again added. The concentration of the impurity added at this time was made higher than that in the previous step. In this embodiment, although arsenic is used as an impurity and its concentration is made $1 \times 10^{21}$ atoms/cm$^3$, it is not necessary to make limitation to this. By the adding step of the impurity, a source region 111, a drain region 112, LDD regions 113, and a channel formation region 114 were defined (FIG. 1F).

After the respective impurity regions were formed in this way, activation of the impurity was carried out by a heat treatment such as furnace annealing, laser annealing, or lamp annealing.

Figure 1G:
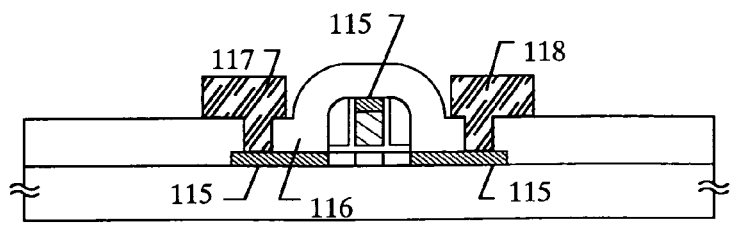

Next, silicon oxide films formed on the surfaces of the gate wiring line 107, the source region 111, and the drain region 112 were removed to expose the surfaces of those. Then a cobalt film (not shown) with a thickness of about 5 nm was formed and a heat treatment step was carried out. A reaction of cobalt and silicon occurred by this heat treatment, so that a silicide layer (cobalt silicide layer) 115 was formed (FIG. 1G).

This technique is a well-known salicide technique. Thus, instead of cobalt, titanium or tungsten may be used, and a heat treatment condition and the like may be determined by referring to a well-known technique. In this embodiment, the heat treatment step was carried out by irradiation of infrared light.

After the silicide layer 115 was formed in this way, the cobalt film was removed. Thereafter, an interlayer insulating film 116 with a thickness of 1 μm was formed. As the interlayer insulating film 116, it is appropriate that a silicon oxide film, a silicon nitride film, a silicon nitride oxide film, or a resin film (polyimide, acryl, polyamide, polyimideamide, benzocyclobutene (BCB), etc.) is used. These insulating films may be laminated in a free combination.

Next, contact holes were formed in the interlayer insulating film 116, and a source wiring line 117 and a drain wiring line 118 made of a material containing aluminum as its main ingredient were formed. Finally, the whole component was subjected to furnace annealing at 300° C. for 2 hours in a hydrogen atmosphere, so that hydrogenating was completed.

A TFT as shown in FIG. 1G was obtained in this way. Incidentally, the structure explained in this embodiment is merely an example, and a TFT structure to which the present invention can be applied is not limited to this. The present invention can be applied to a TFT of any well-known structure. Besides, it is not necessary to limit numerical value conditions in steps subsequent to formation of the crystalline silicon film 104 to those of this embodiment. Further, there is no problem if a well-known channel doping step (impurity adding step for controlling a threshold voltage) is introduced to somewhere in this embodiment.

Besides, in this embodiment, since the concentration of impurities such as C, N, and O was thoroughly controlled at the stage of film formation of the amorphous silicon film as the starting film, the concentration of each impurity contained in the active layer of the completed TFT was such that the concentration of carbon and nitrogen remained to be $5 \times 10^{18}$ atoms/cm$^3$ or less (preferably $1 \times 10^{18}$ atoms/cm$^3$ or less, more preferably $5 \times 10^{17}$ atoms/cm$^3$ or less, further more preferably $2 \times 10^{17}$ atoms/cm$^3$ or less), and the concentration of oxygen remained to be $1.5 \times 10^{19}$ atoms/cm$^3$ or less (preferably $5 \times 10^{18}$ atoms/cm$^3$ or less, more preferably $1 \times 10^{18}$ atoms/cm$^3$ or less). The concentration of metal elements except nickel was $1 \times 10^{17}$ atoms/cm$^3$ or less.

Besides, it is needless to say that the present invention can be applied to not only a top gate structure but also to a bottom gate structure typified by an inverted stagger TFT.

Although the description has been made on the N-channel TFT as an example, it is also easy to fabricate a P-channel TFT through combination with a well-known technique. Further, through combination with a well-known technique, it is also possible to form a CMOS circuit by fabricating an N-channel TFT and a P-channel TFT on the same substrate and by complementarily combining them.

Further, in the structure of FIG. 1G, if a pixel electrode (not shown) electrically connected to the drain wiring line 118 is formed by a well-known means, it is also easy to form a pixel switching element of an active matrix type display device.

That is, the present invention can be also carried out when an active matrix type electro-optical device such as a liquid crystal display device or an EL (electroluminescence) display device is fabricated.

[Findings as to Crystal Structure of an Active Layer]

It is conceivable that an active layer formed in accordance with the foregoing fabricating steps has microscopically a crystal structure in which a plurality of needle-like or rod-like crystals (hereinafter abbreviated to rod-like crystal) are collected and arranged. This can be easily ascertained by observation with TEM (Transmission Electron Microscopy). Moreover, it is also forecasted that the layer has a crystal structure such that the continuity of crystal lattices at crystal grain boundaries is very high.

The continuity at the crystal grain boundary can be ascertained by using electron beam diffraction or X-ray diffraction. The surface (portion forming a channel) of an active layer made of crystalline silicon having crystal lattices with high continuity has the main orientation plane of a {110} plane although crystal axes include deviation a little, and diffraction spots corresponding to the {110} plane clearly appear. The respective spots have a distribution on concentric circles.

Figure 6A:
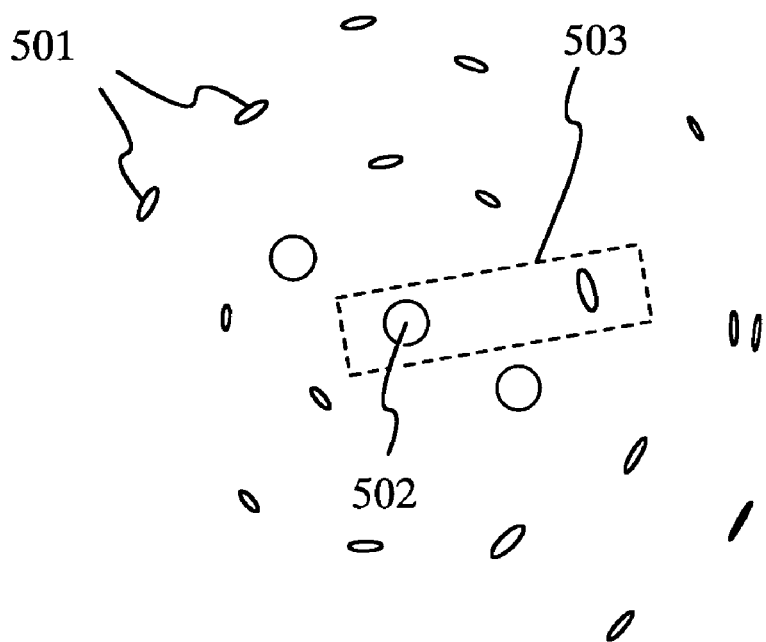
FIGS. 6A and 6B are views schematically showing an electron beam diffraction pattern of Embodiment 1.

The state is schematically shown in FIG. 6. FIG. 6A is a view schematically showing a part of an electron beam diffraction pattern. In FIG. 6A, a plurality of bright spots indicated by 501 are diffraction spots corresponding to <110> incidence. The plurality of diffraction spots 501 are distributed on concentric circles with a center point 502 of an electron beam irradiation area as the center.

Figure 6B:
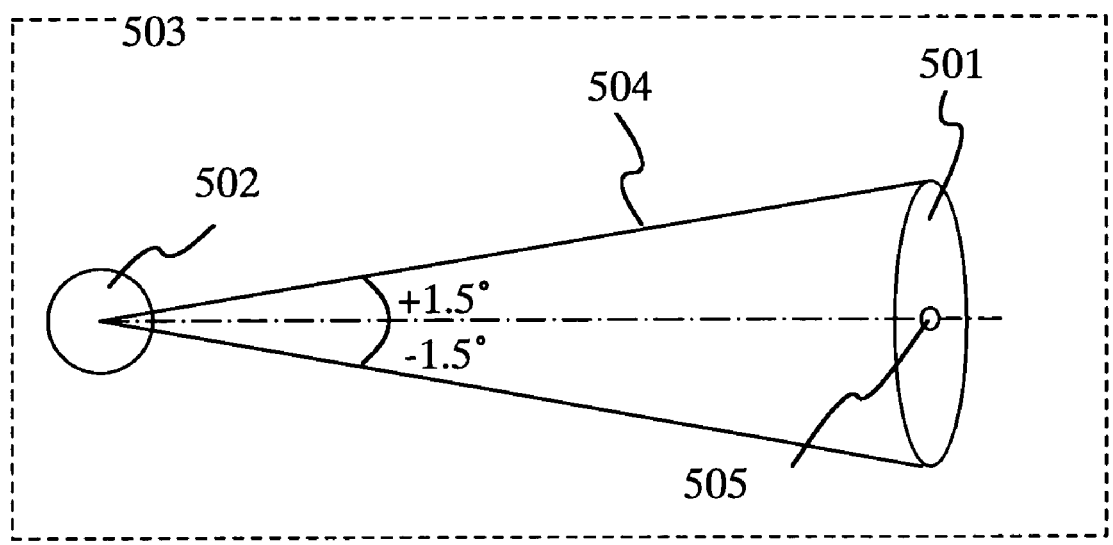

FIG. 6B is an enlarged view of an area 503 encircled with a dotted line. As shown in FIG. 6B, it is understood that the diffraction spot 501 has a distribution (fluctuation) with respect to the center point 502 of the irradiation area.

An angle between a tangential line 504 drawn from the center point 502 of the electron beam irradiation area to the diffraction spot 501 and a line connecting the center point 502 of the electron beam irradiation area and a center point 505 of the diffraction spot becomes 2° or less. At this time, since two tangential lines can be drawn, the expanse of the diffraction spot 1201 eventually falls within the range of ±2°.

This tendency can be seen in the entire region of the actual electron beam diffraction pattern, and totally falls within the range of ±2° (typically ±1.5°, preferably ±0.5°). That the diffraction spot has a distribution means such a state.

It is known that such a distribution of a diffraction spot appears when individual crystal grains having the same crystal axis are collected in a rotative arrangement one another about the crystal axis. That is, when an angle between a specific axis (called an axis A) contained in some crystal plane and an axis (called an axis B) contained in another adjacent crystal plane, which is equivalent to the axis A is called a rotation angle, the position where the diffraction spot appears is shifted by the amount corresponding to the rotation angle.

Thus, in the case where a plurality of crystal grains are collected in positional relations with some rotation angle, one electron beam diffraction pattern can be observed as a collective of diffraction spots shown by the respective crystal grains.

In the case where the diffraction spot has an expanse within the range of ±2° (typically ±1.5°, preferably ±0.5°), it means that an absolute value of a rotation angle made by equivalent axes between adjacent crystal grains is within the range of 4° (typically 3°, preferably 1°).

Incidentally, in the case where the crystal axis is a <110> axis, although a <111> axis can be cited as an equivalent axis contained in the crystal plane, in the crystalline semiconductor thin film of the present invention, there can be seen a number of crystal grain boundaries at which the <111> axes come in contact with each other with an rotation angle of 70.5° (or 70.4°). Also in this case, it is conceivable that the equivalent axis has a rotation angle of 70.5°±2°.

That is, in such a case, among crystal grains, it can be said that an absolute value of a rotation angle made by equivalent axes or axes in a rotation relation of 70.5° with respect to the equivalent axes is within 4° (typically within 3°, preferably within 1°)

Besides, it is also possible to ascertain that continuity exists in crystal lattices at crystal grain boundaries, by observing the crystal grain boundaries with HR-TEM (High Resolution Transmission Electron Microscopy). In the HR-TEM, it is possible to easily ascertain whether the observed lattice stripes are continuously connected at the crystal grain boundary.

The continuity of the crystal lattices at the crystal grain boundary is caused from the fact that the crystal grain boundary is a grain boundary called "planar boundary". The definition of the planar boundary in the specification is "planar boundary" disclosed in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751-758, 1988".

According to the above paper, the planar boundary includes a twin grain boundary, a specific stacking fault, a specific twist grain boundary, and the like. This planar boundary has a feature that it is electrically inactive. That is, although it is a crystal grain boundary, it does not function as a trap to prevent movement of carriers, so that it can be regarded as substantially nonexistent.

Particularly, in the case where a crystal axis (axis normal to a crystal plane) is a <110> axis, a {211} twin grain boundary is also called a coincidence boundary of Σ3. The Σ value is a parameter which becomes an index showing the degree of conformation of the coincidence boundary, and it is known that the smaller the Σ value becomes, the better the conformation of the grain boundary is.

In the crystalline silicon film obtained by carrying out the method of the present invention, almost all crystal grain boundaries (90% or more, typically 95% or more) can be made the coincidence boundary of Σ3, that is, the {211} twin grain boundary.

In a crystal grain boundary formed between two crystal grains, and in the case where plane orientations of both crystals are {110}, when an angle made by lattice stripes corresponding to a {111} plane is made θ, it is known that when θ=70.50, the boundary becomes the coincidence boundary of Σ3.

It has been concluded that the crystalline silicon film of the present invention is a crystalline silicon film in which individual lattice stripes of crystal grains adjacent at a crystal grain boundary are continuous with an angle of about 70.5°, that is, the crystal grain boundary is the {211} twin grain boundary.

Incidentally, when θ=38.9°, the boundary becomes a coincidence boundary of Σ9. Other crystal grain boundaries like this also existed.

Such a coincidence boundary is only formed between crystal grains with the same plane orientation. That is, in the crystalline silicon film, when the plane orientation is almost uniform in {110}, such a coincidence boundary is first formed over a wide range.

Such a crystal structure (precisely, structure of a crystal grain boundary) indicates that two different crystal grains are connected to each other at the crystal grain boundary with extremely excellent conformation. That is, crystal lattices are continuously connected to each other at the crystal grain boundary, and has become such a structure that it is very hard to form trap levels due to crystal defects or the like. Thus, it is possible to consider that a crystal grain boundary does not substantially exist in the crystalline semiconductor thin film having such a crystal structure.

Moreover, by the heat treatment in the reducing atmosphere shown in FIG. 1C, it is almost possible to cause defects existing in the crystal grains to disappear. This can be ascertained from the fact that the number of defects is greatly decreased after this heat treatment.

The difference in the number of defects can be measured as difference in spin density by electron spin resonance spectrometry (Electron Spin Resonance: ESR). By the fabricating steps of the embodiment 1, the spin density of the crystalline silicon film can be made $5\times10^{17}$ spins/cm$^3$ or less (preferably $3\times10^{17}$ spins/cm$^3$ or less). However, since the measurement value is near the detection limit of an existing measuring apparatus, it is expected that an actual spin density is still lower.

Besides, since this heat treatment is carried out in the reducing atmosphere, especially in a hydrogen atmosphere, defects which slightly remain are also terminated with hydrogen and are made inactive. Thus, it is considered that defects in the crystal grains may be regarded as substantially nonexistent.

From the above, in the crystalline semiconductor thin film obtained by carrying out the present invention, since crystal grains and crystal grain boundaries do not substantially exist therein, the film may be considered to be a single crystal semiconductor thin film or substantially single crystal semiconductor thin film.

[Findings as to Electrical Characteristics of a TFT]

A TFT fabricated by using a crystalline silicon film having high continuity at a grain boundary shows electrical characteristics comparable to a MOSFET using pure single crystal silicon.

(1) A subthreshold coefficient as an index of switching performance (promptness in switching of on/off operation)

is as small as 60 to 100 mV/decade (typically 60 to 85 mV/decade) for both an N-channel TFT and a P-channel TFT. (2) A field effect mobility ($\mu_{FE}$) as an index of an operation speed of a TFT can be made as large as 200 to 650 cm$^2$/Vs (typically 300 to 500 cm$^2$/Vs) for an N-channel TFT, and 100 to 300 cm$^2$/Vs (typically 150 to 200 cm$^2$/Vs) for a P-channel TFT. (3) A threshold voltage ($V_{th}$) as an index of a driving voltage of a TFT can be made as small as −0.5 to 1.5 V for an N-channel TFT and −1.5 to 0.5 V for a P-channel TFT.

As described above, it has been ascertained that it is possible to realize extremely superior switching characteristics and high speed operation characteristics.

[Findings as to Circuit Characteristics]

For example, frequency characteristics by a ring oscillator can be cited. The ring oscillator is a circuit in which an odd number of stages of inverter circuits each made of a CMOS structure are connected in a ringlike state, and is used to obtain a delay time per one stage of the inverter circuit. The structure of the ring oscillator is as follows: the number of stages: nine stages, the film thickness of a gate insulating film of a TFT: 30 nm and 50 nm, and the gate length of a TFT: 0.6 μm. By such a ring oscillator, the oscillation frequency can be made 1.04 GHz at the maximum value.

A shift register as one of TEGs of LSI circuits is fabricated, and as an operation frequency, it is possible to generate an output pulse of 100 MHz in the case of a shift register circuit in which the film thickness of a gate insulating film is 30 nm, the gate length is 0.6 μm, the power source voltage is 5 V, and the number of stages is 50.

The surprising data of the ring oscillator and the shift register indicate that the TFT using the crystalline silicon having crystal grain boundaries with the foregoing continuity has performance comparable to or exceeding an IGFET using single crystal silicon.

Embodiment 2

A description will be made of the this embodiment in which the step of removing the metal element in the film is concurrently carried out with the step of hydrogen annealing at 900 to 1200° C. in Embodiment 1.

In the present embodiment, a heat treatment was carried out at 900 to 1200° C. in the atmosphere where 0.1 to 5 wt % of hydrogen halide (typically, hydrogen chloride) is combined in the hydrogen atmosphere. Besides, NF$_3$ or HBr may be used as hydrogen halide.

By adopting this embodiment, it is possible to remove or lower the metal element from the crystalline silicon film. Since the concentration of the metal element is lowered down to 1×10$^{17}$ atoms/cm$^3$ or less, it is possible to prevent TFT characteristics (especially off current value) from fluctuating by the existence of the metal element.

Embodiment 3

Figure 2A:
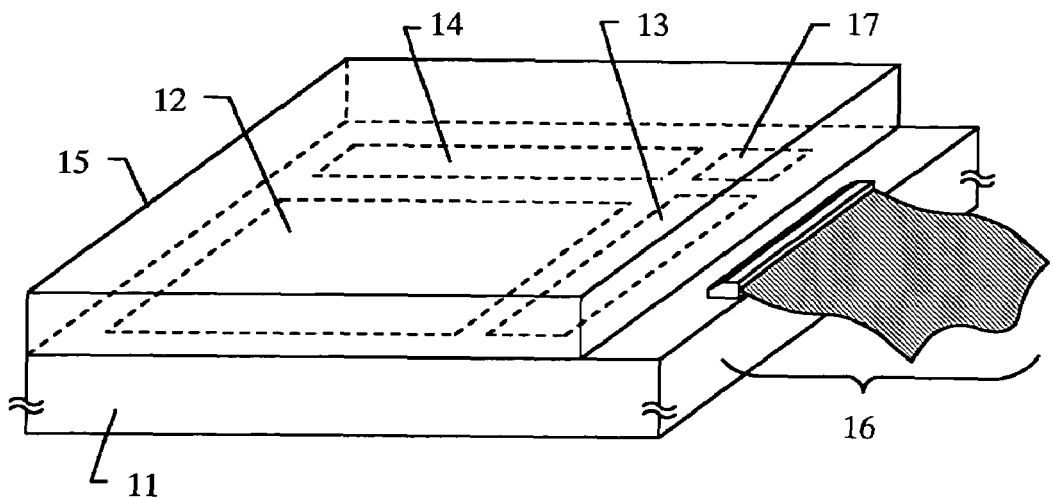
FIGS. 2A to 2C are views showing the structures of an electro-optical device of Embodiment 3.
Figure 2B:
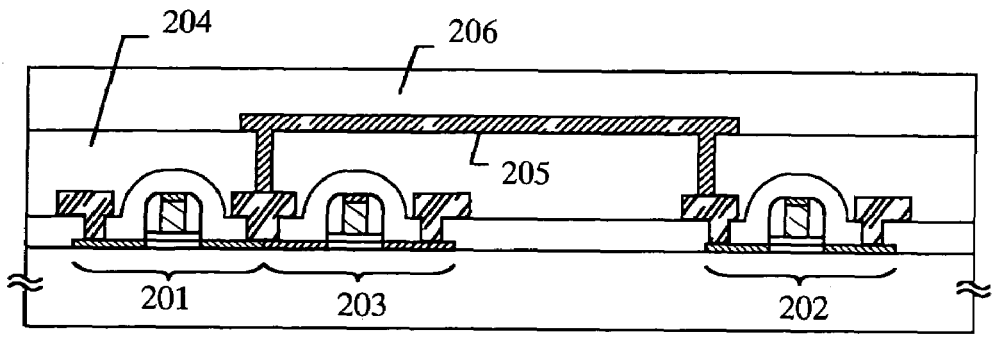
Figure 2C:
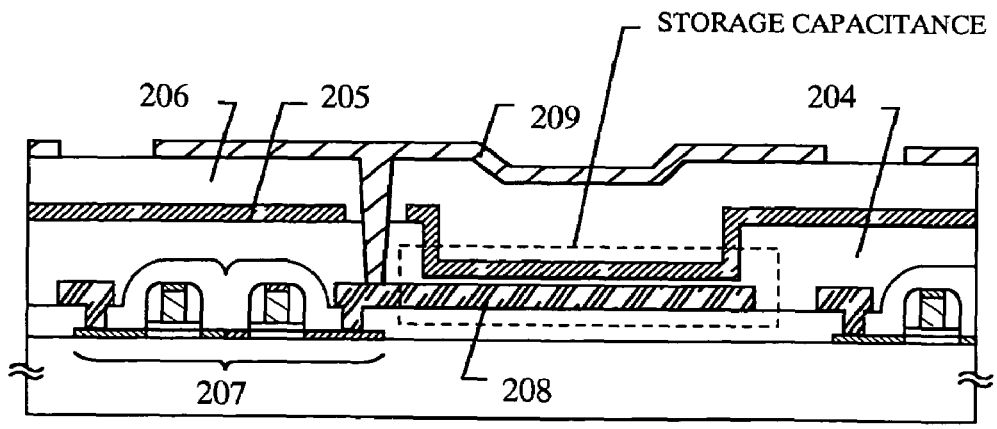

In this embodiment, an example of a reflection-type liquid crystal display device fabricated according to the present invention is shown in FIGS. 2A to 2C. Since well-known means may be used for a fabricating method of a pixel TFT (pixel switching element) and for a cell assembling step, their detailed descriptions will be omitted.

In FIG. 2A, reference numeral 11 denotes a substrate (ceramic substrate provided with a silicon oxide film) having an insulating surface, 12 denotes a pixel matrix circuit, 13 denotes a source driver circuit, 14 denotes a gate driver circuit, 15 denotes an opposite substrate, 16 denotes an FPC (Flexible Printed Circuit), and 17 denotes a signal processing circuit. As the signal processing circuit 17, a circuit for carrying out such processing that an IC has been substituted, such as a D/A converter, a γ-correction circuit, and a signal dividing circuit, can be formed. Of course, it is also possible to provide an IC chip on a glass substrate and to carry out signal processing on the IC chip.

Moreover, although the description has been made of the liquid crystal display device as an example, it is needless to say that the present invention can also be applied to an EL (electroluminescence) display device or an EC (electrochromic) display device as long as the device is an active matrix type display device.

Here, an example of a circuit constituting the driver circuits 13 and 14 of FIG. 2A is shown in FIG. 2B. Since the TFT portion has been explained in the embodiment 1, only necessary portions will be described here.

In FIG. 2B, reference numerals 201 and 202 denote N-channel TFTs, and 203 denotes a P-channel TFT. The TFTs 201 and 203 constitute a CMOS circuit. Reference numeral 204 denotes an insulating layer made of a laminate film of a silicon nitride film/a silicon oxide film/a resin film. A titanium wiring line 205 is provided thereon, and the foregoing CMOS circuit and the TFT 202 are electrically connected. The titanium wiring line is covered with an insulating layer 206 made of a resin film. The two insulating layers 204 and 206 have also a function as a flattened film.

A part of a circuit constituting the pixel matrix circuit 12 of FIG. 2A is shown in FIG. 2C. In FIG. 2C, reference numeral 207 denotes a pixel TFT made of an N-channel TFT of double gate structure, and a drain wiring line 208 is formed so as to widely extend in a pixel region. Incidentally, other than the double gate structure, a single gate structure, a triple gate structure, or the like may be used.

An insulating layer 204 is provided thereon, and a titanium wiring line 205 is provided thereon. At this time, a recess portion is formed in a part of the insulating layer 204, and only silicon nitride and silicon oxide on the lowermost layer are made to remain. By this, an auxiliary capacitance is formed between the drain wiring line 208 and the titanium wiring line 205.

The titanium wiring line 205 provided in the pixel matrix circuit has an electric field shielding effect between source/drain wiring lines and a subsequent pixel electrode. Further, it also functions as a black mask at a gap between a plurality of pixel electrodes.

Then an insulating layer 206 is provided to cover the titanium wiring line 205, and a pixel electrode 209 made of a reflective conductive film is formed thereon. Of course, contrivance for increasing reflectivity may be made to the surface of the pixel electrode 209.

Actually, although an orientation film and a liquid crystal layer are provided on the pixel electrode 209, their explanations will be omitted here.

By using the present invention, it is possible to fabricate the reflection-type liquid crystal display device having the structure as described above. Of course, when a well-known technique is combined, a transmission-type liquid crystal display device can also be easily fabricated. Further, when a well-known technique is combined, an active matrix type EL display device can also be easily fabricated.

Although not distinguished in the drawings, it is also possible to make the film thicknesses of gate insulating films different between the pixel TFT constituting the pixel matrix circuit and the CMOS circuit constituting the driver circuit and the signal processing circuit.

In the pixel matrix circuit, since a driving voltage applied to the TFT is high, the gate insulating film with a film thickness of 50 to 200 nm is required. On the other hand, in the driver circuit and the signal processing circuit, a driving voltage applied to the TFT is low, while high speed operation is required. Thus, it is effective to make the film thickness of the gate insulating film about 3 to 30 nm, which is thinner than that of the pixel TFT.

Embodiment 4

In the liquid crystal display device fabricated in the above embodiment, other than a TN liquid crystal, various liquid crystals may be used. For example, it is possible to use a liquid crystal disclosed in "Characteristics and Driving Scheme of Polymer-Stabilized Monostable FLCD Exhibiting Fast Response Time and High Contrast Ratio with Gray-Scale Capability" by H. Furue et al. 1998 SID, "A Full-Color Thresholdless Antiferroelectric LCD Exhibiting Wide Viewing Angle with Fast Response Time" by T. Yoshida et al., 1997; SID DIGEST, 841, "Thresholdless antiferroelectricity in liquid crystals and its application to displays" by S. Inui et al., 1996, J. Mater. Chem. 6(4), 671-673, or U.S. Pat. No. 5,594,569.

A liquid crystal exhibiting antiferroelectricity in some temperature range is called an antiferroelectric liquid crystal. In mixed liquid crystals including antiferroelectric liquid crystals, there is a thresholdless antiferroelectric mixed liquid crystal exhibiting electro-optical response characteristics in which transmittance is continuously changed with respect to an electric field. Some thresholdless antiferroelectric mixed liquid crystal exhibits V-shaped electro-optical response characteristics, and the liquid crystal in which its driving voltage is about ±2.5 V (cell thickness is about 1 μm to 2 μm) has also been found.

Figure 7:
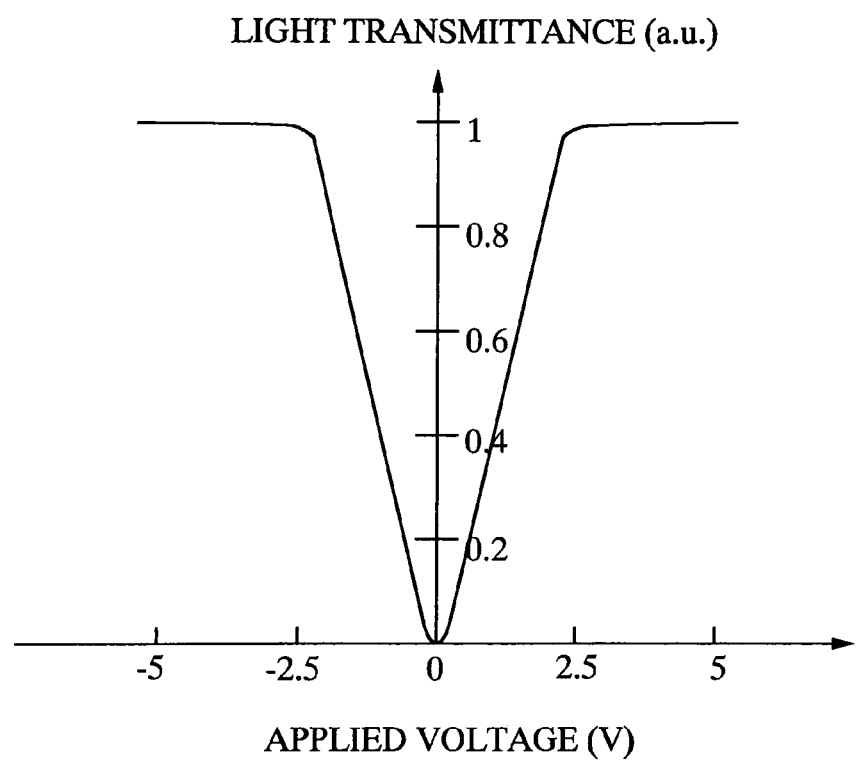
FIG. 7 is a characteristic view of a thresholdless antiferroelectric mixed liquid crystal of Embodiment 4.

Here, FIG. 7 shows an example of characteristics of light transmittance of the thresholdless antiferroelectric mixed liquid crystal showing the V-shaped electro-optical response to applied voltage. The vertical axis of the graph shown in FIG. 7 indicates the transmittance (in arbitrary unit) and the horizontal axis indicates the applied voltage. Incidentally, the transmission axis of a polarizing plate of a liquid crystal display device at an incident side is set almost parallel to a normal direction of a smectic layer of the thresholdless antiferroelectric mixed liquid crystal which is almost coincident with a rubbing direction of the liquid crystal display device. The transmission axis of the polarizing plate at an outgoing side is set almost normal (crossed Nicols) to the transmission axis of the polarizing plate at the incident side.

As shown in FIG. 7, it is understood that when such a thresholdless antiferroelectric mixed liquid crystal is used, low voltage driving and gradation display become possible.

In the case where such a low voltage driving thresholdless antiferroelectric mixed liquid crystal is used for a liquid crystal display device having an analog driver, it becomes possible to suppress the source voltage of a sampling circuit of an image signal to, for example, about 5 V to 8 V. Thus, the operation source voltage of the driver can be lowered, and low power consumption and high reliability of the liquid crystal display device can be realized.

Also in the case where such a low voltage driving thresholdless antiferroelectric mixed liquid crystal is used for a liquid crystal display device having a digital driver, an output voltage of a D/A conversion circuit can be lowered, so that the operation source voltage of the D/A conversion circuit can be lowered and the operation source voltage of the driver can be made low. Thus, low power consumption and high reliability of the liquid crystal display device can be realized.

Thus, to use such a low voltage driving thresholdless antiferroelectric mixed liquid crystal is also effective in the case where a TFT having an LDD region (low concentration impurity region) with a relatively small width (for example, 0 nm to 500 nm or 0 nm to 200 nm) is used.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large storage capacitance for a pixel. Thus, it is preferable to use the thresholdless antiferroelectric mixed liquid crystal having small spontaneous polarization. Besides, it is also permissible to design such that a driving method of the liquid crystal display device is made linear sequential driving, so that a writing period (pixel feed period) of a gradation voltage to a pixel is prolonged and storage capacitance is compensated even if it is small.

Since low voltage driving can be realized by using such a thresholdless antiferroelectric mixed liquid crystal, low power consumption of the liquid crystal display device can be realized.

Incidentally, as long as a liquid crystal has electro-optical characteristics as shown in FIG. 7, any liquid crystal can be used as a display medium of a liquid crystal display device of the present invention.

Embodiment 5

The present invention can be applied to all conventional IC techniques. That is, the present invention can be applied to all semiconductor circuits presently put on the market. For example, the invention may be applied to a microprocessor such as a RICS processor integrated on one chip or an ASIC processor, and may be applied to circuits from a signal processing circuit such as a D/A converter to a high frequency circuit for a portable equipment (portable telephone, PHS, mobile computer).

Figure 3:
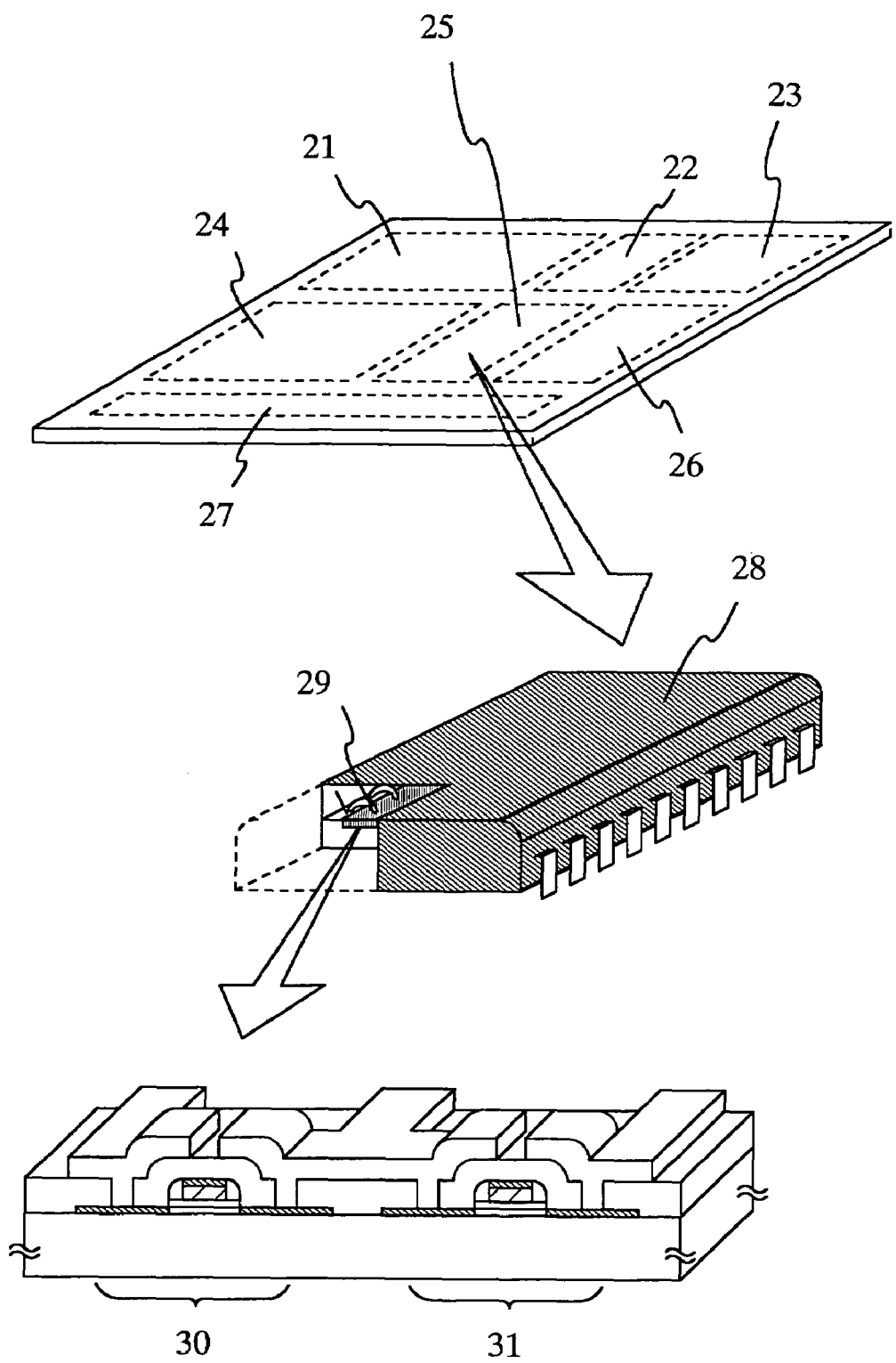
FIG. 3 is a view showing the structure of a semiconductor circuit of Embodiment 5.

FIG. 3 shows an example of a microprocessor. The microprocessor is typically constituted by a CPU core 21, a RAM 22, a clock controller 23, a cache memory 24, a cache controller 25, a serial interface 26, an I/O port 27, and the like.

Of course, the microprocessor shown in FIG. 3 is a simplified example, and various circuit designs are made for an actual microprocessor according to its use.

However, in any microprocessor having any function, it is the IC (Integrated Circuit) 28 that functions as the center. The IC 28 is a functioning circuit in which an integrated circuit formed on a semiconductor chip 29 is protected by a ceramic or the like.

It is an N-channel TFT 30 and a P-channel TFT 31 having structures of the present invention that constitute the integrated circuit formed on the semiconductor chip 29. Incidentally, if a basic circuit is constituted by a CMOS circuit as a minimum unit, power consumption can be suppressed.

The microprocessor shown in this embodiment is mounted on various electronic apparatuses, and functions as the central circuit. As typical electronic apparatuses, a personal computer, a portable information terminal equipment, and other all household electric appliances can be enumerated. Besides, a computer for controlling a vehicle (automobile, electric train, etc.) can also be enumerated.

Embodiment 6

The CMOS circuit or pixel matrix circuit formed by implementing the present invention can be used for a variety of electro-optical devices (such as active matrix type liquid crystal display, active matrix type EL display, and active matrix type EC display). That is, the present invention can be implemented by any electronic apparatus equipped with these electro-optical devices as display media.

Such electronic apparatuses include a video camera, a digital camera, a (rear-type or front-type) projector, a head mount display (a goggle type display), a car navigation system, a personal computer, and a portable information terminal (a mobile computer, a cellular phone or an electronic book, etc.). FIGS. 4A to 4F depict examples of these apparatuses.

Figure 4A:
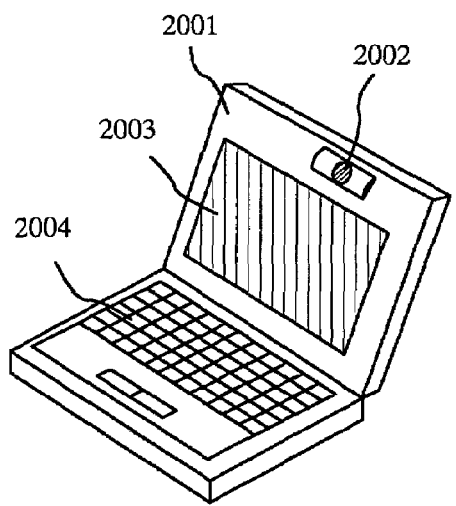
FIGS. 4A to 4F are views showing the structures of electronic apparatuses of Embodiment 6.

FIG. 4A depicts a personal computer that is constituted by a main body 2001, an image input portion 2002, a display device 2003, and a keyboard 2004. The present invention can be applied to the image input portion 2002, the display device 2003, and other signal control circuits.

Figure 4B:
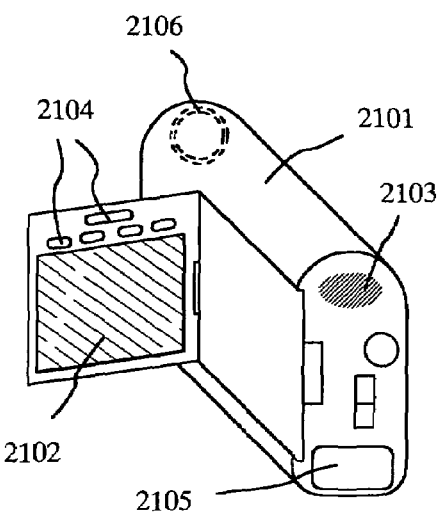

FIG. 4B depicts a video camera that is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 4C:
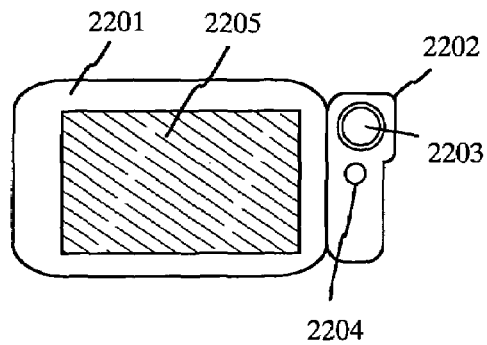

FIG. 4C depicts a mobile computer that is constituted by a main body 2201, a camera unit 2202, an image receiving portion 2203, an operation switch 2204, and a display device 2205. The present invention can be applied to the display device 2205 and other signal control circuits.

Figure 4D:
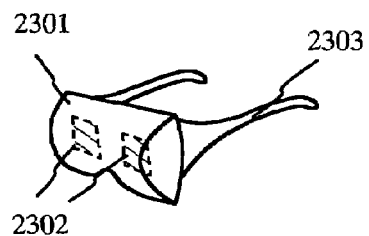

FIG. 4D depicts a goggle type display that is constituted by a main body 2301, a display device 2302, and an arm portion 2303. The present invention can be applied to the display device 2302 and other signal control circuits.

Figure 4E:
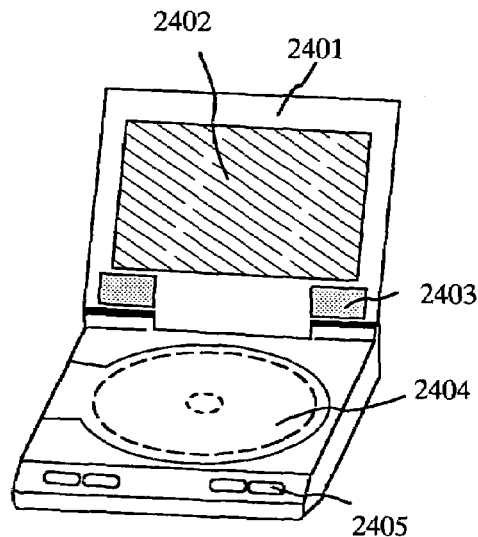

FIG. 4E depicts a player using a recording medium with a recorded program (hereinafter referred to as recording medium), that is constituted by a main body 2401, a display device 2402, a speaker unit 2403, a recording medium 2404, and an operation switch 2405. Incidentally, this apparatus uses a DVD (Digital Versatile Disc), a CD, and the like as the recording medium, and it is possible to appreciate music, to appreciate a movie, to play a game, and to perform the Internet. The present invention can be applied to the display device 2402 and other signal control circuits.

Figure 4F:
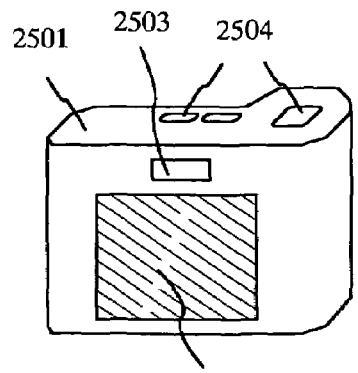

FIG. 4F depicts a digital camera that is constituted by a main body 2501, a display device 2502, an eyepiece portion 2503, an operation switch 2504, and an image receiving portion (not shown). The present invention can be applied to the display device 2502 and other signal control circuits.

Figure 5A:
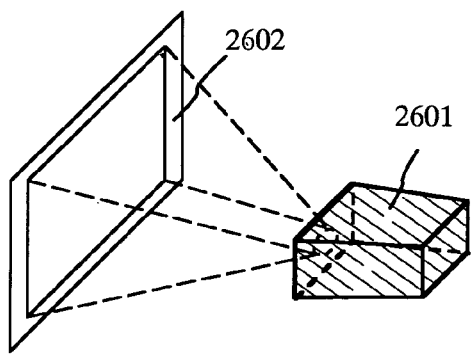
FIGS. 5A to 5D are views showing the structures of electronic apparatuses of Embodiment 6.

FIG. 5A shows a front type projector which is constituted by a light source optical system and a display device 2601, and a screen 2602. The present invention can be applied to the display device and other signal control circuits.

Figure 5B:
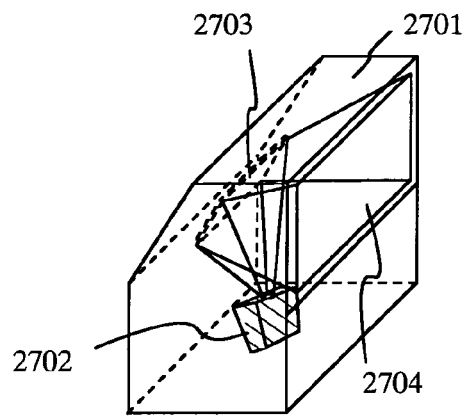

FIG. 5B shows a rear type projector which is constituted by a main body 2701, a light source optical system and a display device 2702, a mirror 2703 and a screen 2704. The present invention can be applied to the display device and other signal control circuits.

Figure 5C:
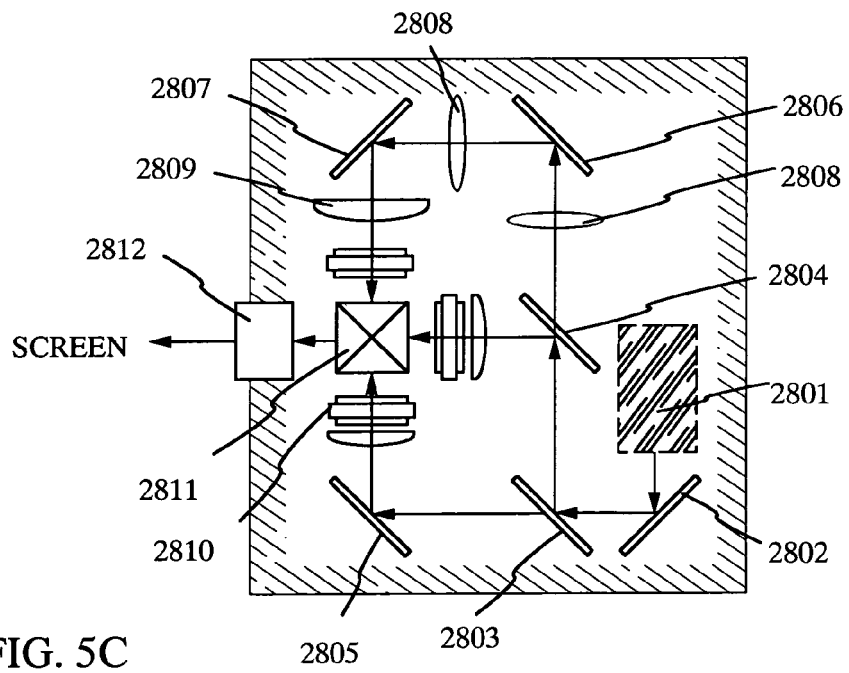

FIG. 5C shows an example structure of a light source optical system and a display device 2601 in FIG. 5A, or 2702 in FIG. 5B. Each of numerals 2601 and 2702 includes a light source optical system 2801, mirrors 2802, 2805-2807, dichroic mirrors 2803 and 2804, an optical lens 2809, a liquid crystal display device 2810, a prism 2811, and a projection optical system 2812. The projection optical system 2812 is constituted by a plurality of optical lenses equipped with a projection lens. Such a projection system as shown in FIG. 5C is called a three-plate type since this structure includes three plates of display devices 2810. Further, it is proper for a researcher to form, in an optical path indicated by an arrow in FIG. 5C, an optical lens, a film with a polarizing characteristics, a film to control a phase difference, an IR film, etc.

Figure 5D:
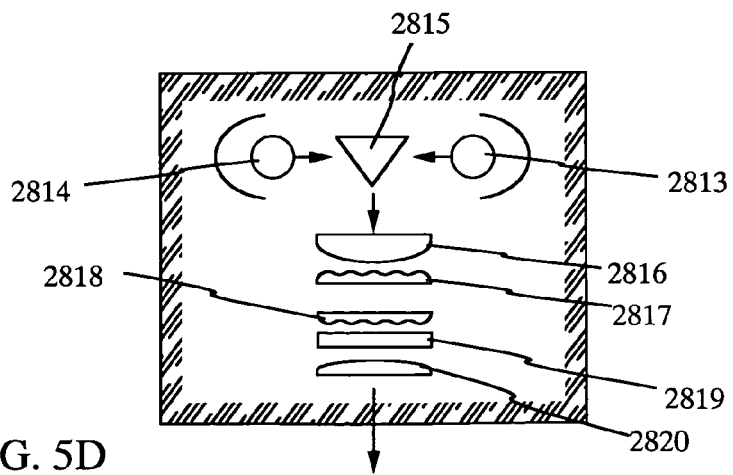

FIG. 5D shown an example structure of a light source optical system 2801 in FIG. 5C.

In this embodiment, the light source optical system 2801 includes light sources 2813 and 2814, a synthetic lens 2815, collimator lenses 2816 and 2820, lens arrays 2817 and 2818, a polarizing conversion element 2819. However, the present invention is not specifically limited by this embodiment because it is just an example. For example, in an optical path, an optical lens, a film with a polarizing characteristics, a film to control a phase difference, an IR film, etc. can be properly formed.

As set forth above, the scope of application of the present invention is extremely broad and the present invention can be applied to electronic apparatuses of any field. Moreover, the electronic apparatuses of this embodiment can be realized even if a structure of any combination of the embodiments 1 to 5 is used.

What is claimed is:

1. A method of manufacturing a semiconductor device comprising:
    carrying out a first heat treatment to convert an amorphous semiconductor film into a crystalline semiconductor film;
    patterning the crystalline semiconductor film to form an active layer;
    after the patterning step, carrying out a second heat treatment at 900 to 1200° C. in a reducing atmosphere in order to flatten a surface of the active layer;
    after the second heat treatment, forming a gate insulating film adjacent to the active layer;
    forming a gate wiring adjacent to the active layer with the gate insulating film having a thickness of 3 to 30 nm interposed therebetween; and
    introducing an impurity into the active layer to form at least a source region and a drain region.

2. A method according to claim 1, wherein the second heat treatment is furnace annealing.

3. A method according to claim 1, wherein the reducing atmosphere includes oxygen or an oxide compound at a concentration not higher than 10 ppm.

4. A method according to claim 1, wherein said crystalline semiconductor film is in combination with a thin film transistor.

5. A method according to claim 1, wherein the semiconductor device is incorporated into one selected from the group consisting of a liquid crystal display device, an EL display device and an EC display device.

6. A method according to claim 1, wherein the semiconductor device is incorporated in an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

7. A method according to claim 1, wherein the reducing atmosphere comprises at least one of hydrogen and ammonia and has a reducing function.

8. A method according to claim 1, wherein a bearing ratio at $2^{-1}$(P-V value) is 29-72% after the second heat treatment.

9. A method according to claim 1, wherein a metal element included in the crystalline semiconductor film is removed in the second heat treatment step.

10. A method of manufacturing a semiconductor device comprising:
- carrying out a first heat treatment to convert an amorphous semiconductor film into a crystalline semiconductor film;
- patterning the crystalline semiconductor film to form an active layer;
- after the patterning step, carrying out a second heat treatment in a reducing atmosphere including a halogen element in order to reduce a natural oxidation film on a surface of the active layer;
- after the second heat treatment, forming a gate insulating film adjacent to the active layer;
- forming a gate wiring adjacent to the active layer with the gate insulating film having a thickness of 3 to 30 nm interposed therebetween; and
- introducing an impurity into the active layer to form at least a source region and a drain region.

11. A method according to claim 10, wherein the second heat treatment is carried out at a temperature of 900 to 1200° C.

12. A method according to claim 10, wherein the second heat treatment is furnace annealing.

13. A method according to claim 10, wherein the reducing atmosphere includes oxygen or an oxide compound at a concentration not higher than 10 ppm.

14. A method according to claim 10, wherein said crystalline semiconductor film is in combination with a thin film transistor.

15. A method according to claim 10, wherein the semiconductor device is incorporated into one selected from the group consisting of a liquid crystal display device, an EL display device and an EC display device.

16. A method according to claim 10, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

17. A method according to claim 10, wherein the reducing atmosphere comprises at least one of hydrogen and ammonia and has a reducing function.

18. A method according to claim 10, wherein a bearing ratio at $2^{-1}$(P-V value) is 29-72% after the second heat treatment.

19. A method according to claim 10, wherein a metal element included in the crystalline semiconductor film is removed in the second heat treatment step.

20. A method of manufacturing a semiconductor device comprising:
- carrying out a first heat treatment to convert an amorphous semiconductor film into a crystalline semiconductor film;
- carrying out a second heat treatment by irradiating the crystalline semiconductor film with an ultraviolet light or an infrared light;
- patterning the crystalline semiconductor film to form an active layer;
- after the patterning step, carrying out a third heat treatment of the crystalline semiconductor film at 900 to 1200° C. in a reducing atmosphere in order to reduce a natural oxidation film on a surface of the active layer;
- after the third heat treatment, forming a gate insulating film adjacent to the active layer;
- forming a gate wiring adjacent to the active layer with the gate insulating film having a thickness of 3 to 30 nm interposed therebetween; and
- introducing an impurity into the active layer to form at least a source region and a drain region.

21. A method according to claim 20, wherein the third heat treatment is furnace annealing.

22. A method according to claim 20, wherein the reducing atmosphere includes oxygen or an oxide compound at a concentration not higher than 10 ppm.

23. A method according to claim 20, wherein said crystalline semiconductor film is in combination with a thin film transistor.

24. A method according to claim 20, wherein the semiconductor device is incorporated into one selected from the group consisting of a liquid crystal display device, an EL display device and an EC display device.

25. A method according to claim 20, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

26. A method according to claim 20, wherein the reducing atmosphere comprises at least one of hydrogen and ammonia and has a reducing function.

27. A method according to claim 20, wherein a bearing ratio at $2^{-1}$(P-V value) is 29-72% after the third heat treatment.

28. A method according to claim 20, wherein a metal element included in the crystalline semiconductor film is removed in the third heat treatment step.

29. A method of manufacturing a semiconductor device comprising:
- carrying out a first heat treatment to convert an amorphous semiconductor film into a crystalline semiconductor film;
- carrying out a second heat treatment by irradiating the crystalline semiconductor film with an ultraviolet light or an infrared light;
- patterning the crystalline semiconductor film to form an active layer;
- after the patterning step, carrying out a third heat treatment of the crystalline semiconductor film in a reducing atmosphere including a halogen element in order to flatten a surface of the active layer;
- after the third heat treatment, forming a gate insulating film having a thickness of 3 to 30 nm adjacent to the active layer;
- forming a gate wiring adjacent to the active layer with the gate insulating film interposed therebetween; and
- introducing an impurity into the active layer to form at least a source region and a drain region.

30. A method according to claim 29, wherein the third heat treatment is carried out at a temperature of 900 to 1200° C.

31. A method according to claim 29, wherein the third heat treatment is furnace annealing.

32. A method according to claim 29, wherein the reducing atmosphere includes oxygen or an oxide compound at a concentration not higher than 10 ppm.

33. A method according to claim 29, wherein said crystalline semiconductor film is in combination with a thin film transistor.

34. A method according to claim 29, wherein the semiconductor device is incorporated into one selected from the group consisting of a liquid crystal display device, an EL display device and an EC display device.

35. A method according to claim 29, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

36. A method according to claim 29, wherein the reducing atmosphere comprises at least one of hydrogen and ammonia and has a reducing function.

37. A method according to claim 29, wherein a bearing ratio at $2^{-1}$(P-V value) is 29-72% after the third heat treatment.

38. A method according to claim 29, wherein a metal element included in the crystalline semiconductor film is removed in the third heat treatment step.

39. A method of manufacturing a semiconductor device including a thin film transistor, said method comprising:
    carrying out a first heat treatment to convert an amorphous semiconductor film into a crystalline semiconductor film;
    carrying out a second heat treatment of the crystalline semiconductor film at 900 to 1200° C. in a reducing atmosphere in order to flatten a surface of the crystalline semiconductor film;
    patterning the crystalline semiconductor film to form an active layer;
    forming a gate insulating film adjacent to the active layer;
    forming a gate wiring adjacent to the active layer with the gate insulating film having a thickness of 3 to 30 nm interposed therebetween; and
    introducing an impurity into the active layer to form at least a source region and a drain region.

40. A method according to claim 39, wherein the second heat treatment is furnace annealing.

41. A method according to claim 39, wherein the reducing atmosphere includes oxygen or an oxide compound at a concentration not higher than 10 ppm.

42. A method according to claim 39, wherein said crystalline semiconductor film is in combination with a thin film transistor.

43. A method according to claim 39, wherein the semiconductor device is incorporated into one selected from the group consisting of a liquid crystal display device, an EL display device and an EC display device.

44. A method according to claim 39, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

45. A method according to claim 39, wherein the reducing atmosphere comprises at least one of hydrogen and ammonia and has a reducing function.

46. A method according to claim 39, wherein a bearing ratio at $2^{-1}$(P-V value) is 29-72% after the second heat treatment.

47. A method according to claim 39, wherein a metal element included in the crystalline semiconductor film is removed in the second heat treatment step.

48. A method of manufacturing a semiconductor device including a thin film transistor, said method comprising:
    carrying out a first heat treatment to convert an amorphous semiconductor film into a crystalline semiconductor film;
    carrying out a second heat treatment of the crystalline semiconductor film in a reducing atmosphere including a halogen element in order to reduce a natural oxidation film on a surface of the crystalline semiconductor film;
    patterning the crystalline semiconductor film to form an active layer;
    forming a gate insulating film adjacent to the active layer;
    forming a gate wiring adjacent to the active layer with the gate insulating film having a thickness of 3 to 30 nm interposed therebetween; and
    introducing an impurity into the active layer to form at least a source region and a drain region.

49. A method according to claim 48, wherein the second heat treatment is carried out at a temperature of 900 to 1200° C.

50. A method according to claim 48, wherein the second heat treatment is furnace annealing.

51. A method according to claim 48, wherein the reducing atmosphere includes oxygen or an oxide compound at a concentration not higher than 10 ppm.

52. A method according to claim 48, wherein said crystalline semiconductor film is in combination with a thin film transistor.

53. A method according to claim 48, wherein the semiconductor device is incorporated into one selected from the group consisting of a liquid crystal display device, an EL display device and an EC display device.

54. A method according to claim 48, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

55. A method according to claim 48, wherein the reducing atmosphere comprises at least one of hydrogen and ammonia and has a reducing function.

56. A method according to claim 48, wherein a bearing ratio at $2^{-1}$(P-V value) is 29-72% after the second heat treatment.

57. A method according to claim 48, wherein a metal element included in the crystalline semiconductor film is removed in the second heat treatment step.

58. A method of manufacturing a semiconductor device including a thin film transistor, said method comprising:
    carrying out a first heat treatment to convert an amorphous semiconductor film into a crystalline semiconductor film;
    carrying out a second heat treatment by irradiating the crystalline semiconductor film with an ultraviolet light or an infrared light;
    carrying out a third heat treatment of the crystalline semiconductor film at 900 to 1200° C. in a reducing atmosphere in order to reduce a natural oxidation film on a surface of the crystalline semiconductor film;
    patterning the crystalline semiconductor film to form an active layer;

forming a gate insulating film having a thickness of 3 to 30 nm adjacent to the active layer;

forming a gate wiring adjacent to the active layer with the gate insulating film interposed therebetween; and introducing an impurity into the active layer to form at least a source region and a drain region.

59. A method according to claim 58, wherein the third heat treatment is furnace annealing.

60. A method according to claim 58, wherein the reducing atmosphere includes oxygen or an oxide compound at a concentration not higher than 10 ppm.

61. A method according to claim 58, wherein said crystalline semiconductor film is in combination with a thin film transistor.

62. A method according to claim 58, wherein the semiconductor device is incorporated into one selected from the group consisting of a liquid crystal display device, an EL display device and an EC display device.

63. A method according to claim 58, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

64. A method according to claim 58, wherein the reducing atmosphere comprises at least one of hydrogen and ammonia and has a reducing function.

65. A method according to claim 58, wherein a bearing ratio at $2^{-1}$(P-V value) is 29-72% after the third heat treatment.

66. A method according to claim 58, wherein a metal element included in the crystalline semiconductor film is removed in the third heat treatment step.

67. A method of manufacturing a semiconductor device including a thin film transistor, said method comprising:

carrying out a first heat treatment to convert an amorphous semiconductor film into a crystalline semiconductor film;

carrying out a second heat treatment by irradiating the crystalline semiconductor film with an ultraviolet light or an infrared light;

carrying out a third heat treatment of the crystalline semiconductor film in a reducing atmosphere including a halogen element in order to flatten a surface of the crystalline semiconductor film;

patterning the crystalline semiconductor film to form an active layer;

forming a gate insulating film adjacent to the active layer;

forming a gate wiring adjacent to the active layer with the gate insulating film having a thickness of 3 to 30 nm interposed therebetween; and introducing an impurity into the active layer to form at least a source region and a drain region.

68. A method according to claim 67, wherein the third heat treatment is carried out at a temperature of 900 to 1200° C.

69. A method according to claim 67, wherein the third heat treatment is furnace annealing.

70. A method according to claim 67, wherein said crystalline semiconductor film is in combination with a thin film transistor.

71. A method according to claim 67, wherein the semiconductor device is incorporated into one selected from the group consisting of a liquid crystal display device, an EL display device and an EC display device.

72. A method according to claim 67, wherein the semiconductor device is incorporated into an electronic device selected from the group consisting of a video camera, a digital camera, a rear-type projector, a front-type projector, a head mount display (a goggle type display), a car navigation system, a personal computer, and a portable information terminal such as a mobile computer, a cellular phone or an electronic book.

73. A method according to claim 67, wherein the reducing atmosphere includes oxygen or an oxide compound at a concentration not higher than 10 ppm.

74. A method according to claim 67, wherein the reducing atmosphere comprises at least one of hydrogen and ammonia and has a reducing function.

75. A method according to claim 67, wherein a bearing ratio at $2^{-1}$(P-V value) is 29-72% after the third heat treatment.

76. A method according to claim 67, wherein a metal element included in the crystalline semiconductor film is removed in the third heat treatment step.

* * * * *